(12) United States Patent
Gross et al.

(10) Patent No.: US 10,633,279 B2
(45) Date of Patent: Apr. 28, 2020

(54) GLASSES WITH LOW EXCESS MODIFIER CONTENT

(71) Applicant: CORNING INCORPORATED, Corning, NY (US)

(72) Inventors: Timothy Michael Gross, Corning, NY (US); Xiaoju Guo, Painted Post, NY (US); Peter Joseph Lezzi, Corning, NY (US); Alexandra Lai Ching Kao Andrews Mitchell, Ithaca, NY (US); Rostislav Vatchev Roussev, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/202,691

(22) Filed: Nov. 28, 2018

(65) Prior Publication Data

US 2019/0161390 A1 May 30, 2019

Related U.S. Application Data

(60) Provisional application No. 62/591,953, filed on Nov. 29, 2017.

(51) Int. Cl.

| | |
|---|---|
| *C03C 3/091* | (2006.01) |
| *C03C 3/097* | (2006.01) |
| *C03C 3/085* | (2006.01) |
| *H05K 5/03* | (2006.01) |
| *H05K 5/00* | (2006.01) |
| *C03C 4/18* | (2006.01) |
| *C03C 21/00* | (2006.01) |

(52) U.S. Cl.
CPC ............ *C03C 3/097* (2013.01); *C03C 3/085* (2013.01); *C03C 3/091* (2013.01); *C03C 4/18* (2013.01); *C03C 21/002* (2013.01); *H05K 5/0017* (2013.01); *H05K 5/03* (2013.01); *C03C 2204/00* (2013.01)

(58) Field of Classification Search
CPC .......... C03C 3/083; C03C 3/091; C03C 3/097
See application file for complete search history.

(56) References Cited

U.S. PATENT DOCUMENTS

| | | | |
|---|---|---|---|
| 3,433,611 A * | 3/1969 | Kubichan ............. | C03C 21/002 501/63 |
| 8,518,545 B2 | 8/2013 | Akiba et al. | |
| 8,652,979 B2 | 2/2014 | Murata | |
| 9,593,042 B2 | 3/2017 | Hu et al. | |
| 10,065,880 B2 | 9/2018 | Gross et al. | |
| 2003/0109370 A1 | 6/2003 | Ikenishi et al. | |
| 2011/0111160 A1 | 5/2011 | Kawai | |
| 2012/0052271 A1* | 3/2012 | Gomez ............. | C03C 3/091 428/213 |
| 2012/0183812 A1 | 7/2012 | Kajita | |
| 2012/0321898 A1 | 12/2012 | Meinhardt et al. | |
| 2013/0288001 A1 | 10/2013 | Murata et al. | |
| 2014/0023865 A1* | 1/2014 | Comte ............. | C03C 3/083 428/410 |
| 2014/0308526 A1 | 10/2014 | Chapman et al. | |
| 2014/0364298 A1 | 12/2014 | Ohara et al. | |
| 2016/0102011 A1* | 4/2016 | Hu ............ | C03C 3/093 428/155 |
| 2016/0376186 A1 | 12/2016 | Gross | |
| 2017/0197869 A1 | 7/2017 | Beall et al. | |
| 2017/0295657 A1 | 10/2017 | Gross et al. | |
| 2017/0341973 A1 | 11/2017 | Gross et al. | |
| 2018/0118615 A1 | 5/2018 | Fukada et al. | |

FOREIGN PATENT DOCUMENTS

| | | |
|---|---|---|
| JP | 03144830 B2 | 3/2001 |
| JP | 2014141363 A | 8/2014 |

OTHER PUBLICATIONS

International Search Report and Written Opinion PCT/US2018/063012 dated Feb. 26, 2019, 10 Pgs.
International Searching Authority Invitation to Pay Additional Fees PCT/US2018/062989 dated Feb. 5, 2019, 11 Pgs.
International Search Report and Written Opinion PCT/US2018/062989 dated Apr. 17, 2019, 16 Pgs.
TW107142600 Office Action and Search Report dated May 28, 2019, Taiwan Patent Office, 2 Pgs.

* cited by examiner

*Primary Examiner* — Elizabeth A. Bolden
(74) *Attorney, Agent, or Firm* — Kevin M. Johnson

(57) ABSTRACT

A glass composition includes: from 55.0 mol % to 70.0 mol % $SiO_2$; from 12.0 mol % to 20.0 mol % $Al_2O_3$; from 5.0 mol % to 15.0 mol % $Li_2O$; and from 4.0 mol % to 15.0 mol % $Na_2O$. The glass composition has the following relationships $-8.00$ mol % $\leq R_2O+RO-Al_2O_3-B_2O_3-P_2O_5 \leq -1.75$ mol %, $9.00 \leq (SiO_2+Al_2O_3+Li_2O)/Na_2O$, and $(Li_2O+Al_2O_3+P_2O_5)/(Na_2O+B_2O_3) \leq 3.50$. The glass composition may be used in a glass article or a consumer electronic product.

12 Claims, 2 Drawing Sheets

GLASSES WITH LOW EXCESS MODIFIER CONTENT

RELATED APPLICATIONS

This application claims the benefit of priority of U.S. Provisional Application Ser. No. 62/591,953 filed on Nov. 29, 2017, the contents of which are relied upon and incorporated herein by reference in their entirety.

BACKGROUND

Field

The present specification generally relates to glass compositions suitable for use as cover glass for electronic devices. More specifically, the present specification is directed to lithium containing aluminosilicate glasses that may be formed into cover glass for electronic devices by fusion drawing.

Technical Background

The mobile nature of portable devices, such as smart phones, tablets, portable media players, personal computers, and cameras, makes these devices particularly vulnerable to accidental dropping on hard surfaces, such as the ground. These devices typically incorporate cover glasses, which may become damaged upon impact with hard surfaces. In many of these devices, the cover glasses function as display covers, and may incorporate touch functionality, such that use of the devices is negatively impacted when the cover glasses are damaged.

There are two major failure modes of cover glass when the associated portable device is dropped on a hard surface. One of the modes is flexure failure, which is caused by bending of the glass when the device is subjected to dynamic load from impact with the hard surface. The other mode is sharp contact failure, which is caused by introduction of damage to the glass surface. Impact of the glass with rough hard surfaces, such as asphalt, granite, etc., can result in sharp indentations in the glass surface. These indentations become failure sites in the glass surface from which cracks may develop and propagate.

Glass can be made more resistant to flexure failure by the ion-exchange technique, which involves inducing compressive stress in the glass surface. However, the ion-exchanged glass will still be vulnerable to dynamic sharp contact, owing to the high stress concentration caused by local indentations in the glass from the sharp contact.

It has been a continuous effort for glass makers and handheld device manufacturers to improve the resistance of handheld devices to sharp contact failure. Solutions range from coatings on the cover glass to bezels that prevent the cover glass from impacting the hard surface directly when the device drops on the hard surface. However, due to the constraints of aesthetic and functional requirements, it is very difficult to completely prevent the cover glass from impacting the hard surface.

It is also desirable that portable devices be as thin as possible. Accordingly, in addition to strength, it is also desired that glasses to be used as cover glass in portable devices be made as thin as possible. Thus, in addition to increasing the strength of the cover glass, it is also desirable for the glass to have mechanical characteristics that allow it to be formed by processes that are capable of making thin glass articles, such as thin glass sheets.

Accordingly, a need exists for glasses that can be strengthened, such as by ion exchange, and that have the mechanical properties that allow them to be formed as thin glass articles.

SUMMARY

According to a first embodiment, a glass composition comprising: from greater than or equal to 55.0 mol % to less than or equal to 70.0 mol % $SiO_2$; from greater than or equal to 12.0 mol % to less than or equal to 20.0 mol % $Al_2O_3$; from greater than or equal to 5.0 mol % to less than or equal to 15.0 mol % $Li_2O$; and from greater than or equal to 4.0 mol % to less than or equal to 15.0 mol % $Na_2O$, wherein $-8.00$ mol % $\leq R_2O+RO-Al_2O_3-B_2O_3-P_2O_5 \leq -1.75$ mol %, $9.00 \leq (SiO_2+Al_2O_3+Li_2O)/Na_2O$, and $(Li_2O+Al_2O_3+P_2O_5)/(Na_2O+B_2O_3) \leq 3.50$.

According to a second embodiment, a glass article comprises: a first surface; a second surface opposite the first surface, wherein a thickness (t) of the glass article is measured as a distance between the first surface and the second surface; and a compressive stress layer extending from at least one of the first surface and the second surface into the thickness (t) of the glass article, wherein a central tension of the glass article is greater than or equal to 60 MPa, the compressive stress layer has a depth of compression that is from greater than or equal to 0.15t to less than or equal to 0.25t, and the glass article is formed from a glass comprising: from greater than or equal to 55.0 mol % to less than or equal to 70.0 mol % $SiO_2$; from greater than or equal to 12.0 mol % to less than or equal to 20.0 mol % $Al_2O_3$; from greater than or equal to 5.0 mol % to less than or equal to 15.0 mol % $Li_2O$; and from greater than or equal to 4.0 mol % to less than or equal to 15.0 mol % $Na_2O$, wherein $-8.00$ mol % $\leq R_2O+RO-Al_2O_3-B_2O_3-P_2O_5 \leq -1.75$ mol %, $9.00 \leq (SiO_2+Al_2O_3+Li_2O)/Na_2O$, and $(Li_2O+Al_2O_3+P_2O_5)/(Na_2O+B_2O_3) \leq 3.50$.

According to a third embodiment, a glass article comprises: a first surface; a second surface opposite the first surface, wherein a thickness (t) of the glass article is measured as a distance between the first surface and the second surface; and a compressive stress layer extending from at least one of the first surface and the second surface into the thickness (t) of the glass article, wherein a central tension of the glass article is greater than or equal to 60 MPa, the compressive stress layer has a depth of compression that is from greater than or equal to 0.15t to less than or equal to 0.25t, and the glass article has a composition at a center depth of the glass article comprising: from greater than or equal to 55.0 mol % to less than or equal to 70.0 mol % $SiO_2$; from greater than or equal to 12.0 mol % to less than or equal to 20.0 mol % $Al_2O_3$; from greater than or equal to 5.0 mol % to less than or equal to 15.0 mol % $Li_2O$; and from greater than or equal to 4.0 mol % to less than or equal to 15.0 mol % $Na_2O$, wherein $-8.00$ mol % $\leq R_2O+RO-Al_2O_3-B_2O_3-P_2O_5 \leq -1.75$ mol %, $9.00 \leq (SiO_2+Al_2O_3+Li_2O)/Na_2O$, and $(Li_2O+Al_2O_3+P_2O_5)/(Na_2O+B_2O_3) \leq 3.50$.

According to a fourth embodiment, a glass composition comprises: from greater than or equal to 60.0 mol % to less than or equal to 70.0 mol % $SiO_2$; from greater than or equal to 12.0 mol % to less than or equal to 18.0 mol % $Al_2O_3$; from greater than or equal to 5.0 mol % to less than or equal to 10.0 mol % $Li_2O$; from greater than or equal to 4.0 mol % to less than or equal to 10.0 mol % $Na_2O$; and greater than or equal to 0.75 mol % $P_2O_5$, wherein $Li_2O/Na_2O$ greater than or equal to 1.00, and $Al_2O_3+Li_2O$ less than or equal to 25.25 mol %.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
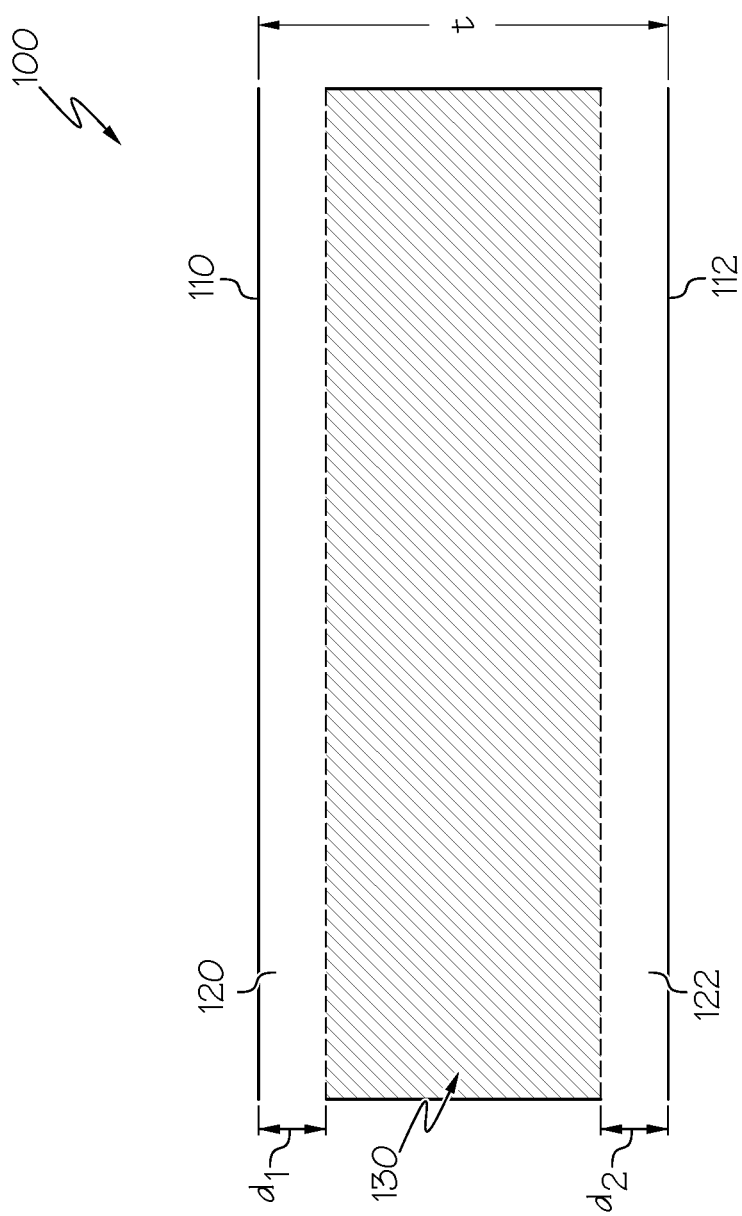
FIG. 1 schematically depicts a cross section of a glass having compressive stress layers on surfaces thereof according to embodiments disclosed and described herein.

Reference will now be made in detail to alkali aluminosilicate glasses according to various embodiments. Alkali aluminosilicate glasses have good ion exchangeability, and chemical strengthening processes have been used to achieve high strength and high toughness properties in alkali aluminosilicate glasses. Sodium aluminosilicate glasses are highly ion exchangeable glasses with high glass formability and quality. The substitution of $Al_2O_3$ into the silicate glass network increases the interdiffusivity of monovalent cations during ion exchange. By chemical strengthening in a molten salt bath (e.g., $KNO_3$ and/or $NaNO_3$), glasses with high strength, high toughness, and high indentation cracking resistance can be achieved.

Therefore, alkali aluminosilicate glasses with good physical properties, chemical durability, and ion exchangeability have drawn attention for use as cover glass. In particular, lithium containing aluminosilicate glasses, which have lower annealing and softening temperatures, lower coefficient of thermal expansion (CTE) values, and fast ion exchangeability, are provided herein. Through different ion exchange processes, greater central tension (CT), depth of compression (DOC), and high compressive stress (CS) can be achieved. However, the addition of lithium in the alkali aluminosilicate glass may reduce the melting point, softening point, or liquidus viscosity of the glass.

Drawing processes for forming glass articles, such as, for example, glass sheets, are desirable because they allow a thin glass article to be formed with few defects. It was previously thought that glass compositions were required to have relatively high liquidus viscosities—such as a liquidus viscosity greater than 1000 kP, greater than 1100 kP, or greater than 1200 kP—to be formed by a drawing process, such as, for example, fusion drawing or slot drawing. However, developments in drawing processes allow glasses with lower liquidus viscosities to be used in drawing processes. Thus, glasses used in drawing processes may include more lithia than previously thought, and may include more glass network forming components, such as, for example, $SiO_2$, $Al_2O_3$, and $B_2O_3$. Accordingly, a balance of the various glass components that allows the glass to realize the benefits of adding lithium and glass network formers to the glass composition, but that does not negatively impact the glass composition are provided herein.

In embodiments of glass compositions described herein, the concentration of constituent components (e.g., $SiO_2$, $Al_2O_3$, $Li_2O$, and the like) are given in mole percent (mol %) on an oxide basis, unless otherwise specified. Components of the alkali aluminosilicate glass composition according to embodiments are discussed individually below. It should be understood that any of the variously recited ranges of one component may be individually combined with any of the variously recited ranges for any other component.

In embodiments of the alkali aluminosilicate glass compositions disclosed herein, $SiO_2$ is the largest constituent and, as such, $SiO_2$ is the primary constituent of the glass network formed from the glass composition. Pure $SiO_2$ has a relatively low CTE and is alkali free. However, pure $SiO_2$ has a high melting point. Accordingly, if the concentration of $SiO_2$ in the glass composition is too high, the formability of the glass composition may be diminished as higher concentrations of $SiO_2$ increase the difficulty of melting the glass, which, in turn, adversely impacts the formability of the glass. In embodiments, the glass composition generally comprises $SiO_2$ in an amount from greater than or equal to 55.0 mol % to less than or equal to 70.0 mol %, and all ranges and sub-ranges between the foregoing values. In some embodiments, the glass composition comprises $SiO_2$ in amounts greater than or equal to 58.0 mol %, such as greater than or equal to 60.0 mol %, greater than or equal to 62.0 mol %, greater than or equal to 64.0 mol %, greater than or equal to 66.0 mol %, or greater than or equal to 68.0 mol %. In embodiments, the glass composition comprises $SiO_2$ in amounts less than or equal to 68.0 mol %, such as less than or equal to 66.0 mol %, less than or equal to 64.0 mol %, less than or equal to 62.0 mol %, less than or equal to 60.0 mol %, or less than or equal to 58.0 mol %. It should be understood that, in embodiments, any of the above ranges may be combined with any other range. In embodiments, the glass composition comprises $SiO_2$ in an amount from greater than or equal to 58.0 mol % to less than or equal to 68.0 mol %, such as from greater than or equal to 60.0 mol % to less than or equal to 66.0 mol %, or from greater than or equal to 62.0 mol % to less than or equal to 64.0 mol %, and all ranges and sub-ranges between the foregoing values.

The glass composition of embodiments may further comprise $Al_2O_3$. $Al_2O_3$ may serve as a glass network former, similar to $SiO_2$. $Al_2O_3$ may increase the viscosity of the glass composition due to its tetrahedral coordination in a glass melt formed from a glass composition, decreasing the formability of the glass composition when the amount of $Al_2O_3$ is too high. However, when the concentration of $Al_2O_3$ is balanced against the concentration of $SiO_2$ and the concentration of alkali oxides in the glass composition, $Al_2O_3$ can reduce the liquidus temperature of the glass melt, thereby enhancing the liquidus viscosity and improving the compatibility of the glass composition with certain forming processes, such as the fusion forming process. In embodiments, the glass composition generally comprises $Al_2O_3$ in a concentration of from greater than or equal to 12.0 mol % to less than or equal to 20.0 mol %, and all ranges and sub-ranges between the foregoing values. In some embodiments, the glass composition comprises $Al_2O_3$ in amounts greater than or equal to 13.0 mol %, such as greater than or equal to 14.0 mol %, greater than or equal to 15.0 mol %, greater than or equal to 16.0 mol %, greater than or equal to 17.0 mol %, or greater than or equal to 18.0 mol %. In embodiments, the glass composition comprises $Al_2O_3$ in amounts less than or equal to 19.0 mol %, such as less than or equal to 18.0 mol %, less than or equal to 17.0 mol %, less than or equal to 16.0 mol %, less than or equal to 15.0 mol %, less than or equal to 14.0 mol %, or less than or equal to 13.0 mol %. It should be understood that, in embodiments, any of the above ranges may be combined with any other range. In embodiments, the glass composition comprises $Al_2O_3$ in an amount from greater than or equal to 13.0 mol % to less than or equal to 19.0 mol %, such as from greater than or equal to 14.0 mol % to less than or equal to 18.0 mol %, or from greater than or equal to 15.0 mol % to less than or equal to 17.0 mol %, and all ranges and sub-ranges between the foregoing values.

Like $SiO_2$ and $Al_2O_3$, $P_2O_5$ may be added to the glass composition as a network former, thereby reducing the meltability and formability of the glass composition. Thus, $P_2O_5$ may be added in amounts that do not overly decrease these properties. The addition of $P_2O_5$ may also increase the diffusivity of ions in the glass composition during ion exchange treatment, thereby increasing the efficiency of these treatments. In embodiments, the glass composition may comprise $P_2O_5$ in amounts from greater than or equal to 0.0 mol % to less than or equal to 5.0 mol %, and all ranges and sub-ranges between the foregoing values. In some embodiments, the glass composition may comprise $P_2O_5$ in amounts greater than or equal to 0.5 mol %, such as greater than or equal to 1.0 mol %, greater than or equal to 1.5 mol %, greater than or equal to 2.0 mol %, greater than or equal to 2.5 mol %, greater than or equal to 3.0 mol %, greater than or equal to 3.5 mol %, greater than or equal to 4.0 mol %, or greater than or equal to 4.5 mol %. In embodiments, the glass composition may comprise $P_2O_5$ in an amount less than or equal to 4.5 mol %, such as less than or equal to 4.0 mol %, less than or equal to 3.5 mol %, less than or equal to 3.0 mol %, less than or equal to 2.5 mol %, less than or equal to 2.0 mol %, less than or equal to 1.5 mol %, less than or equal to 1.0 mol %, or less than or equal to 0.5 mol %. It should be understood that, in embodiments, any of the above ranges may be combined with any other range. In embodiments, the glass composition may comprise $P_2O_5$ in amounts from greater than or equal to 0.5 mol % to less than or equal to 4.5 mol %, such as from greater than or equal to 1.0 mol % to less than or equal to 4.0 mol %, from greater than or equal to 1.5 mol % to less than or equal to 3.5 mol %, or from greater than or equal to 2.0 mol % to less than or equal to 3.0 mol %, and all ranges and sub-ranges between the foregoing values.

Like $SiO_2$, $Al_2O_3$, and $P_2O_5$, $B_2O_3$ may be added to the glass composition as a network former, thereby reducing the meltability and formability of the glass composition. Thus, $B_2O_3$ may be added in amounts that do not overly decrease these properties. In embodiments, the glass composition may comprise $B_2O_3$ in amounts from greater than or equal to 0.0 mol % $B_2O_3$ to less than or equal to 8.0 mol % $B_2O_3$, and all ranges and sub-ranges between the foregoing values. In some embodiments, the glass composition may comprise $B_2O_3$ in amounts greater than or equal to 0.5 mol %, such as greater than or equal to 1.0 mol %, greater than or equal to 1.5 mol %, greater than or equal to 2.0 mol %, greater than or equal to 2.5 mol %, greater than or equal to 3.0 mol %, greater than or equal to 3.5 mol %, greater than or equal to 4.0 mol %, greater than or equal to 4.5 mol %, or equal to 5.0 mol %, greater than or equal to 5.5 mol %, greater than or equal to 6.0 mol %, greater than or equal to 6.5 mol %, greater than or equal to 7.0 mol %, or greater than or equal to 7.5 mol %. In embodiments, the glass composition may comprise $B_2O_3$ in an amount less than or equal to 7.5 mol %, such as less than or equal to 7.0 mol %, less than or equal to 6.5 mol %, less than or equal to 6.0 mol %, less than or equal to 5.5 mol %, less than or equal to 5.0 mol %, less than or equal to 4.5 mol %, less than or equal to 4.0 mol %, less than or equal to 3.5 mol %, less than or equal to 3.0 mol %, less than or equal to 2.5 mol %, less than or equal to 2.0 mol %, less than or equal to 1.5 mol %, less than or equal to 1.0 mol %, or less than or equal to 0.5 mol %. It should be understood that, in embodiments, any of the above ranges may be combined with any other range. In embodiments, the glass composition comprises $B_2O_3$ in amounts from greater than or equal to 0.5 mol % to less than or equal to 7.5 mol %, such as greater than or equal to 1.0 mol % to less than or equal to 7.0 mol %, greater than or equal to 1.5 mol % to less than or equal to 6.5 mol %, greater than or equal to 2.0 mol % to less than or equal to 6.0 mol %, greater than or equal to 2.5 mol % to less than or equal to 5.5 mol %, or greater than or equal to 3.0 mol % to less than or equal to 5.0 mol %, and all ranges and sub-ranges between the foregoing values.

In some embodiments, the glass composition comprises at least one of $B_2O_3$ and $P_2O_5$ as glass network forming elements. Accordingly, in embodiments $B_2O_3+P_2O_5$ is greater than 0.0 mol %, such as greater than or equal to 0.5 mol %, greater than or equal to 1.0 mol %, greater than or equal to 1.5 mol %, greater than or equal to 2.0 mol %, greater than or equal to 2.5 mol %, greater than or equal to 3.0 mol %, greater than or equal to 3.5 mol %, greater than or equal to 4.0 mol %, greater than or equal to 4.5 mol %, greater than or equal to 5.0 mol %, greater than or equal to 5.5 mol %, greater than or equal to 6.0 mol %, greater than or equal to 6.5 mol %, greater than or equal to 7.0 mol %, greater than or equal to 7.5 mol %, or greater than or equal to 8.0 mol %, and all ranges and sub-ranges between the foregoing values. In embodiments, $B_2O_3+P_2O_5$ is less than or equal to 7.5 mol %, such as less than or equal to 7.0 mol %, less than or equal to 6.5 mol %, less than or equal to 6.0 mol %, less than or equal to 5.5 mol %, less than or equal to 5.0 mol %, less than or equal to 4.5 mol %, less than or equal to 4.0 mol %, less than or equal to 3.5 mol %, less than or equal to 3.0 mol %, less than or equal to 2.5 mol %, less than or equal to 2.0 mol %, less than or equal to 1.5 mol %, less than or equal to 1.0 mol %, or less than or equal to 0.5 mol %. It should be understood that, in embodiments, any of the above ranges may be combined with any other range. In embodiments, the glass composition comprises $B_2O_3+P_2O_5$ in amounts from greater than or equal to 0.5 mol % to less than or equal to 7.5 mol %, such as greater than or equal to 1.0 mol % to less than or equal to 7.0 mol %, greater than or equal to 1.5 mol % to less than or equal to 6.5 mol %, greater than or equal to 2.0 mol % to less than or equal to 6.0 mol %, greater than or equal to 2.5 mol % to less than or equal to 5.5 mol %, or greater than or equal to 3.0 mol % to less than or equal to 5.0 mol %, and all ranges and sub-ranges between the foregoing values.

The effects of $Li_2O$ in the glass composition are discussed above and discussed in further detail below. In part, the addition of lithium in the glass allows for better control of an ion exchange process and further reduces the softening point of the glass. In embodiments, the glass composition generally comprises $Li_2O$ in an amount from greater than or equal to 5.0 mol % to less than or equal to 15.0 mol %, and all ranges and sub-ranges between the foregoing values. In some embodiments, the glass composition comprises $Li_2O$ in amounts greater than or equal to 5.5 mol %, such as greater than or equal to 6.0 mol %, greater than or equal to 6.5 mol %, greater than or equal to 7.0 mol %, greater than or equal to 7.5 mol %, greater than or equal to 8.0 mol %, greater than or equal to 8.5 mol %, greater than or equal to 9.0 mol %, greater than or equal to 9.5 mol %, greater than or equal to 10.0 mol %, greater than or equal to 10.5 mol %, greater than or equal to 11.0 mol %, greater than or equal to 11.5 mol %, greater than or equal to 12.0 mol %, greater than or equal to 12.5 mol %, greater than or equal to 13.0 mol %, greater than or equal to 13.5 mol %, greater than or equal to 14.0 mol %, or greater than or equal to 14.5 mol %. In some embodiments, the glass composition comprises $Li_2O$ in amounts less than or equal to 14.5 mol %, such as less than or equal to 14.0 mol %, less than or equal to 13.5 mol %, less than or equal to 13.0 mol %, less than or equal to 12.5 mol %, less than or equal to 12.0 mol %, less than or equal to 11.5 mol %, less than or equal to 11.0 mol %, less than or equal to 10.5 mol %, less than or equal to 10.0 mol %, less than or equal to 9.5 mol %, less than or equal to 9.0 mol %, less than or equal to 8.5 mol %, less than or equal to 8.0 mol %, less than or equal to 7.5 mol %, less than or equal to 7.0 mol %, less than or equal to 6.5 mol %, less than or equal to 6.0 mol %, or less than or equal to 5.5 mol %. It should be understood that, in embodiments, any of the above ranges may be combined with any other range. In embodiments, the glass composition comprises $Li_2O$ in an amount from greater than or equal to 5.5 mol % to less than or equal to 14.5 mol %, such as from greater than or equal to 6.0 mol % to less than or equal to 14.0 mol %, from greater than or equal to 6.5 mol % to less than or equal to 13.5 mol %, from greater than or equal to 7.0 mol % to less than or equal to 13.0 mol %, from greater than or equal to 7.5 mol % to less than or equal to 12.5 mol %, from greater than or equal to 8.0 mol % to less than or equal to 12.0 mol %, from greater than or equal to 8.5 mol % to less than or equal to 11.5 mol %, or from greater than or equal to 9.0 mol % to less than or equal to 10.0 mol %, and all ranges and sub-ranges between the foregoing values.

In addition to being a glass network forming component, $Al_2O_3$ also aids in increasing the ion exchangeability of the glass composition. Therefore, in embodiments, the amount of $Al_2O_3$ and other components that may be ion exchanged may be relatively high. For example, $Li_2O$ is an ion exchangeable component. In some embodiments, the amount of $Al_2O_3+Li_2O$ in the glass composition may be greater than 21.4 mol %, such as greater than or equal to 22.0 mol %, greater than or equal to 22.5 mol %, greater than or equal to 23.0 mol %, greater than or equal to 23.5 mol %, greater than or equal to 24.0 mol %, greater than or equal to 24.5 mol %, greater than or equal to 25.0 mol %, greater than or equal to 25.5 mol %, or greater than or equal to 26.0 mol %, and all ranges and sub-ranges between the foregoing values. In some embodiments, the amount of $Al_2O_3+Li_2O$ is less than or equal to 26.5 mol %, such as less than or equal to 26.0 mol %, less than or equal to 25.5 mol %, less than or equal to 25.0 mol %, less than or equal to 24.5 mol %, less than or equal to 24.0 mol %, less than or equal to 23.5 mol %, less than or equal to 23.0 mol %, less than or equal to 22.5 mol %, or less than or equal to 22.0 mol %, and all ranges and sub-ranges between the foregoing values. It should be understood that, in embodiments, any of the above ranges may be combined with any other range. In embodiments, the amount of $Al_2O_3+Li_2O$ is from greater than or equal to 21.5 mol % to less than or equal to 26.5 mol %, such as from greater than or equal to 22.0 mol % to less than or equal to 26.0 mol %, from greater than or equal to 22.5 mol % to less than or equal to 25.5 mol %, from greater than or equal to 23.0 mol % to less than or equal to 25.0 mol %, or from greater than or equal to 23.5 mol % to less than or equal to 24.5 mol %, and all ranges and sub-ranges between the foregoing values.

According to embodiments, the glass composition may also comprise alkali metal oxides other than $Li_2O$, such as $Na_2O$. $Na_2O$ aids in the ion exchangeability of the glass composition, and also increases the melting point of the glass composition and improves formability of the glass composition. However, if too much $Na_2O$ is added to the glass composition, the CTE may be too low, and the melting point may be too high. In embodiments, the glass composition generally comprises $Na_2O$ in an amount from greater than 4.0 mol % $Na_2O$ to less than or equal to 15 mol % $Na_2O$, and all ranges and sub-ranges between the foregoing values. In some embodiments, the glass composition comprises $Na_2O$ in amounts greater than or equal to 4.5 mol %, such as greater than or equal to 5.0 mol %, greater than or equal to 5.5 mol %, greater than or equal to 6.0 mol %, greater than or equal to 6.5 mol %, greater than or equal to 7.0 mol %, greater than or equal to 7.5 mol %, greater than or equal to 8.0 mol %, greater than or equal to 8.5 mol %, greater than or equal to 9.0 mol %, greater than or equal to 9.5 mol %, greater than or equal to 10.0 mol %, greater than or equal to 10.5 mol %, greater than or equal to 11.0 mol %, greater than or equal to 11.5 mol %, greater than or equal to 12.0 mol %, greater than or equal to 12.5 mol %, greater than or equal to 13.0 mol %, greater than or equal to 13.5 mol %, greater than or equal to 14.0 mol %, or greater than or equal to 14.5 mol %. In some embodiments, the glass composition comprises $Na_2O$ in amounts less than or equal to 14.5 mol %, such as less than or equal to 14.0 mol %, less than or equal to 13.5 mol %, less than or equal to 13.0 mol %, less than or equal to 12.5 mol %, less than or equal to 12.0 mol %, less than or equal to 11.5 mol %, less than or equal to 11.0 mol %, less than or equal to 10.5 mol %, less than or equal to 10.0 mol %, less than or equal to 9.5 mol %, less than or equal to 9.0 mol %, less than or equal to 8.5 mol %, less than or equal to 8.0 mol %, less than or equal to 7.5 mol %, less than or equal to 7.0 mol %, less than or equal to 6.5 mol %, less than or equal to 6.0 mol %, less than or equal to 5.5 mol %, less than or equal to 5.0 mol %, or less than or equal to 4.5 mol %. It should be understood that, in embodiments, any of the above ranges may be combined with any other range. In embodiments, the glass composition comprises $Na_2O$ in an amount from greater than or equal to 4.5 mol % to less than or equal to 14.5 mol %, such as from greater than or equal to 5.0 mol % to less than or equal to 14.0 mol %, from greater than or equal to 5.5 mol % to less than or equal to 13.5 mol %, from greater than or equal to 6.0 mol % to less than or equal to 13.0 mol %, from greater than or equal to 6.5 mol % to less than or equal to 12.5 mol %, from greater than or equal to 7.0 mol % to less than or equal to 12.0 mol %, from greater than or equal to 7.5 mol % to less than or equal to 11.5 mol %, or from greater than or equal to 8.0 mol % to less than or equal to 10.0 mol %, and all ranges and sub-ranges between the foregoing values.

As noted above, $Al_2O_3$ aids in increasing the ion exchangeability of the glass composition. Therefore, in embodiments, the amount of $Al_2O_3$ and other components that may be ion exchanged may be relatively high. For example, $Li_2O$ and $Na_2O$ are ion exchangeable components. In some embodiments, the amount of $Al_2O_3+Li_2O+Na_2O$ in the glass composition may be greater than 25.0 mol %, such as greater than or equal to 25.5 mol %, greater than or equal to 26.0 mol %, greater than or equal to 26.5 mol %, greater than or equal to 27.0 mol %, greater than or equal to 27.5 mol %, greater than or equal to 28.0 mol %, greater than or equal to 28.5 mol %, greater than or equal to 29.0 mol %, or greater than or equal to 29.5 mol %, and all ranges and sub-ranges between the foregoing values. In some embodiments, the amount of $Al_2O_3+Li_2O+Na_2O$ is less than or equal to 30.0 mol %, such as less than or equal to 29.5 mol %, less than or equal to 29.0 mol %, less than or equal to 28.5 mol %, less than or equal to 28.0 mol %, less than or equal to 27.5 mol %, less than or equal to 27.0 mol %, less than or equal to 26.5 mol %, less than or equal to 26.0 mol %, or less than or equal to 25.5 mol %, and all ranges and sub-ranges between the foregoing values. It should be understood that, in embodiments, any of the above ranges may be combined with any other range. In embodiments, the amount of $Al_2O_3+Li_2O+Na_2O$ is from greater than or equal to 25.0 mol % to less than or equal to 30.0 mol %, such as from greater than or equal to 25.5 mol % to less than or equal to 29.5 mol %, from greater than or equal to 26.0 mol % to less than or equal to 29.0 mol %, from greater than or equal to 26.5 mol % to less than or equal to 28.5 mol %, or from greater than or equal to 27.0 mol % to less than or equal to 28.0 mol %, and all ranges and sub-ranges between the foregoing values.

Like $Na_2O$, $K_2O$ also promotes ion exchange and increases the DOC of a compressive stress layer. However, adding $K_2O$ may cause the CTE may be too low, and the melting point may be too high. In embodiments, the glass composition is substantially free or free of potassium. As used herein, the term "substantially free" means that the component is not added as a component of the batch material even though the component may be present in the final glass in very small amounts as a contaminant, such as less than 0.01 mol %. In embodiments, $K_2O$ may be present in the glass composition in amounts less than 1 mol %.

MgO lowers the viscosity of a glass, which enhances the formability, the strain point and the Young's modulus, and may improve the ion exchange ability. However, when too much MgO is added to the glass composition, the density and the CTE of the glass composition increase. In embodiments, the glass composition generally comprises MgO in a concentration of from greater than or equal to 0.0 mol % to less than or equal to 2.0 mol %, and all ranges and sub-ranges between the foregoing values. In some embodiments, the glass composition comprises MgO in amounts greater than or equal to 0.2 mol %, such as greater than or equal to 0.4 mol %, greater than or equal to 0.6 mol %, greater than or equal to 0.8 mol %, greater than or equal to 1.0 mol %, greater than or equal to 1.2 mol %, greater than or equal to 1.4 mol %, greater than or equal to 1.6 mol %, or greater than or equal to 1.8 mol %. In some embodiments, the glass composition comprises MgO in amounts less than or equal to 1.8 mol %, such as less than or equal to 1.6 mol %, less than or equal to 1.4 mol %, less than or equal to 1.2 mol %, less than or equal to 1.0 mol %, less than or equal to 0.8 mol %, less than or equal to 0.6 mol %, less than or equal to 0.4 mol %, or less than or equal to 0.2 mol %. It should be understood that, in embodiments, any of the above ranges may be combined with any other range. In embodiments, the glass composition comprises MgO in an amount from greater than or equal to 0.2 mol % to less than or equal to 1.8 mol %, such as from greater than or equal to 0.4 mol % to less than or equal to 1.6 mol %, from greater than or equal to 0.6 mol % to less than or equal to 1.4 mol %, or from greater than or equal to 0.8 mol % to less than or equal to 1.2 mol %, and all ranges and sub-ranges between the foregoing values.

CaO lowers the viscosity of a glass, which enhances the formability, the strain point and the Young's modulus, and may improve the ion exchange ability. However, when too much CaO is added to the glass composition, the density and the CTE of the glass composition increase. In embodiments, the glass composition generally comprises CaO in a concentration of from greater than or equal to 0.0 mol % to less than or equal to 3.0 mol %, and all ranges and sub-ranges between the foregoing values. In some embodiments, the glass composition comprises CaO in amounts greater than or equal to 0.2 mol %, such as greater than or equal to 0.4 mol %, greater than or equal to 0.6 mol %, greater than or equal to 0.8 mol %, greater than or equal to 1.0 mol %, greater than or equal to 1.2 mol %, greater than or equal to 1.4 mol %, greater than or equal to 1.6 mol %, greater than or equal to 1.8 mol %, greater than or equal to 2.0 mol %, greater than or equal to 2.2 mol %, greater than or equal to 2.4 mol %, greater than or equal to 2.6 mol %, or greater than or equal to 2.8 mol %. In some embodiments, the glass composition comprises CaO in amounts less than or equal to 2.8 mol %, such as less than or equal to 2.6 mol %, less than or equal to 2.4 mol %, less than or equal to 2.2 mol %, less than or equal to 2.0 mol %, less than or equal to 1.8 mol %, less than or equal to 1.6 mol %, less than or equal to 1.4 mol %, less than or equal to 1.2 mol %, less than or equal to 1.0 mol %, less than or equal to 0.8 mol %, less than or equal to 0.6 mol %, less than or equal to 0.4 mol %, or less than or equal to 0.2 mol %. It should be understood that, in embodiments, any of the above ranges may be combined with any other range. In embodiments, the glass composition comprises CaO in an amount from greater than or equal to 0.2 mol % to less than or equal to 2.8 mol %, such as from greater than or equal to 0.4 mol % to less than or equal to 2.6 mol %, from greater than or equal to 0.6 mol % to less than or equal to 2.4 mol %, or from greater than or equal to 0.8 mol % to less than or equal to 2.2 mol %, from greater than or equal to 1.0 mol % to less than or equal to 2.0 mol %, from greater than or equal to 1.2 mol % to less than or equal to 1.8 mol %, or from greater than or equal to 1.4 mol % to less than or equal to 1.6 mol %, and all ranges and sub-ranges between the foregoing values.

In embodiments, the glass composition may optionally include one or more fining agents. In some embodiments, the fining agents may include, for example, $SnO_2$. In such embodiments, $SnO_2$ may be present in the glass composition in an amount less than or equal to 0.2 mol %, such as from greater than or equal to 0.0 mol % to less than or equal to 0.1 mol %, and all ranges and sub-ranges between the foregoing values. In embodiments, $SnO_2$ may be present in the glass composition in an amount from greater than or equal to 0.0 mol % to less than or equal to 0.2 mol %, or greater than or equal to 0.1 mol % to less than or equal to 0.2 mol %, and all ranges and sub-ranges between the foregoing values. In some embodiments, the glass composition may be substantially free or free of $SnO_2$.

ZnO enhances the ion exchange performance of a glass, such as by increasing the compressive stress of the glass. However, adding too much ZnO may increase density and cause phase separation. In embodiments, the glass composition may comprise ZnO in amounts from greater than or equal to 0.0 mol % to less than or equal to 1.5 mol %, such as from greater than or equal to 0.2 mol % to less than or equal to 1.0 mol %, and all ranges and sub-ranges between the foregoing values. In some embodiments, the glass composition may comprise ZnO in amounts greater than or equal to 0.3 mol %, such as greater than or equal to 0.4 mol %, or greater than or equal to 0.5 mol %. In embodiments, the glass composition may comprise ZnO in amounts less than or equal to 1.0 mol %, such as less than or equal to 0.8 mol %, or less than or equal to 0.6 mol %. It should be understood that, in embodiments, any of the above ranges may be combined with any other range.

SrO lowers the liquidus temperature of glass articles disclosed herein. In embodiments, the glass composition may comprise SrO in amounts from greater than or equal to 0.0 mol % to less than or equal to 1.5 mol %, such as from greater than or equal to 0.2 mol % to less than or equal to 1.0 mol %, and all ranges and sub-ranges between the foregoing values. In some embodiments, the glass composition may comprise SrO in amounts greater than or equal to 0.2 mol % or greater than or equal to 0.4 mol %. In embodiments, the glass composition may comprise SrO in amounts less than or equal to 0.8 mol %, such as less than or equal to 0.6 mol %, or less than or equal to 0.4 mol %. It should be understood that, in embodiments, any of the above ranges may be combined with any other range.

In addition to the above individual components, glass compositions according to embodiments disclosed herein may comprise divalent cation oxides (referred to herein as RO) in amounts from greater than or equal to 0.0 mol % to less than or equal to 5.0 mol %, and all ranges and sub-ranges between the foregoing values. As used herein, divalent cation oxides (RO) include, but are not limited to, MgO, CaO, SrO, BaO, FeO, and ZnO. In some embodiments, the glass composition may comprise RO in an amount greater than or equal to 0.2 mol %, such as greater than or equal to 0.5 mol %, greater than or equal to 1.0 mol %, greater than or equal to 1.5 mol %, greater than or equal to 2.0 mol %, greater than or equal to 2.5 mol %, greater than or equal to 3.0 mol %, greater than or equal to 3.5 mol %, greater than or equal to 4.0 mol %, or greater than or equal to 4.5 mol %. In embodiments, the glass composition may comprise RO in an amount less than or equal to 4.5 mol %, such as less than or equal to 4.0 mol %, less than or equal to 3.5 mol %, less than or equal to 3.0 mol %, less than or equal to 2.5 mol %, less than or equal to 2.0 mol %, less than or equal to 1.5 mol %, less than or equal to 1.0 mol %, or less than or equal to 0.5 mol %. It should be understood that, in embodiments, any of the above ranges may be combined with any other range. In embodiments, the glass composition may comprise RO in amounts from greater than or equal to 0.2 mol % to less than or equal to 4.5 mol %, such as greater than or equal to 0.5 mol % to less than or equal to 4.0 mol %, greater than or equal to 1.0 mol % to less than or equal to 3.5 mol %, greater than or equal to 1.5 mol % to less than or equal to 3.0 mol %, or greater than or equal to 2.0 mol % to less than or equal to 2.5 mol %, and all ranges and sub-ranges between the foregoing values.

In embodiments, a relationship, in mol %, of $Al_2O_3/(R_2O+RO)$ is greater than 0.90, where RO is the sum of divalent cation oxides, and $R_2O$ is the sum of alkali metal oxides. As utilized herein, $R_2O$ includes $Li_2O$, $Na_2O$, $K_2O$, $Rb_2O$, $Cs_2O$, and $Fr_2O$. In embodiments $Al_2O_3/(R_2O+RO)$ is from greater than 0.90 to less than 1.20. Having an increased ratio of $Al_2O_3$ to $R_2O+RO$ improves the liquidus temperature and viscosity of the glass article. This ratio results in a more dense glass that is less brittle and has higher damage resistance. In some embodiments, the molar ratio of $Al_2O_3/(R_2O+RO)$ is greater than or equal to 0.95, such as greater than or equal to 1.00, greater than or equal to 1.05, greater than or equal to 1.08, greater than or equal to 1.10, or greater than or equal to 1.15. In embodiments, a molar ratio of $Al_2O_3/(R_2O+RO)$ is less than or equal to 1.20, such as less than or equal to 1.50, less than or equal to 1.00, less than or equal to 0.98, less than or equal to 0.95, or less than or equal to 0.92. It should be understood that, in embodiments, any of the above ranges may be combined with any other range. In embodiments, the molar ratio of $Al_2O_3/(R_2O+RO)$ is from greater than or equal to 0.90 to less than or equal to 1.50, such as from greater than or equal to 0.95 to less than or equal to 1.20, from greater than or equal to 0.98 to less than or equal to 1.15, or from greater than or equal to 1.00 to less than or equal to 1.10, and all ranges and sub-ranges between the foregoing values.

In embodiments, the total amount of network forming components (e.g., $Al_2O_3+SiO_2+B_2O_3+P_2O_5$) is greater than or equal to 80 mol %, such as greater than or equal to 82 mol %, greater than or equal to 84 mol %, greater than or equal to 86 mol %, greater than or equal to 88 mol %, or greater than or equal to 90 mol %. Having a high amount of network forming components increases the density of the glass, which makes it less brittle and improves the damage resistance. In embodiments, the total amount of network forming components is less than or equal to 94 mol %, such as less than or equal to 92 mol %, less than or equal to 90 mol %, less than or equal to 88 mol %, less than or equal to 86 mol %, less than or equal to 84 mol %, or less than or equal to 82 mol %. It should be understood that, in embodiments, any of the above ranges may be combined with any other range. In embodiments, the total amount of network forming components is from greater than or equal to 80 mol % to less than or equal to 94 mol %, such as greater than or equal to 82 mol % to less than or equal to 92 mol %, greater than or equal to 84 mol % to less than or equal to 90 mol %, or greater than or equal to 86 mol % to less than or equal to 88 mol %, and all ranges and sub-ranges between the foregoing values.

In one or more embodiments, the alkali aluminosilicate glass article comprises a relationship, in mol %, $-8.00 \leq R_2O+RO-Al_2O_3-B_2O_3-P_2O_5 \leq -1.75$. Without being bound to any particular theory, having excess $R_2O$ and RO in the glass composition can lead to high levels of non-bridging oxygen in the glass. The presence of excess non-bridging oxygen in the glass may lead to reduced resistance to point contact damage. On the other hand, if the quantity of non-bridging oxygen is too low, then the melt quality of the glass is compromised. Therefore, in embodiments, it may be desirable to limit the amount of non-bridging oxygen in the glass composition, yet not remove it entirely. It is believed that $Al_2O_3$, $B_2O_3$, and $P_2O_5$ will react with $R_2O$ and RO components in the glass composition; thereby limiting the amount of non-bridging oxygen in the glass composition. Accordingly, in embodiments, it may be desirable for the molar percent of $Al_2O_3$, $B_2O_3$, and $P_2O_5$ in the glass composition to be near the molar percent of $R_2O$ and RO in the glass composition, as reflected in the above inequality. In one or more embodiments, $-7.50 \leq R_2O+RO-Al_2O_3-B_2O_3-P_2O_5 \leq -2.50$, such as $-6.50 \leq R_2O+RO-Al_2O_3-B_2O_3-P_2O_5 \leq -3.00$, $-5.50 \leq R_2O+RO-Al_2O_3-B_2O_3-P_2O_5 \leq -3.50$, or $-4.50 \leq R_2O+RO-Al_2O_3-B_2O_3-P_2O_5 \leq -3.50$, and all ranges and sub-ranges between the foregoing values.

In one or more embodiments, the alkali aluminosilicate glass article comprises a relationship, in mol %, $9.00 \leq (SiO_2+Al_2O_3+Li_2O)/Na_2O$. Without being bound by any particular theory, $Na^+$ cations have lower field strength than $Si^{4+}$, $Al^{3+}$, and $Li^+$ cations, and glasses containing higher field strength cations generally have higher packing densities enabling higher stored tensile stress (CT). The oxides of high field strength cations should be increased relative to the oxides of low field strength cations to improve CT, however some amount of oxide of low field strength cations is desired to reduce the liquidus temperature. In embodiments, $9.00 \leq (SiO_2+Al_2O_3+Li_2O)/Na_2O \leq 16.00$, such as $9.20 \leq (SiO_2+Al_2O_3+Li_2O)/Na_2O \leq 15.50$, $9.50 \leq (SiO_2+Al_2O_3+Li_2O)/Na_2O \leq 15.00$, $10.00 \leq (SiO_2+Al_2O_3+Li_2O)/Na_2O \leq 14.50$, or $10.50 \leq (SiO_2+Al_2O_3+Li_2O)/Na_2O \leq 14.00$, and all ranges and sub-ranges between the foregoing values.

In some embodiments, the alkali aluminosilicate glass article comprises a relationship, in mol %, $(Li_2O+Al_2O_3+P_2O_5)/(Na_2O+B_2O_3) \leq 3.50$. Without being bound by any particular theory, it is believed the $Na_2O$ modifier oxide is advantaged over $Li_2O$ modifier oxide to improve free volume and the corresponding indentation crack resistance. Likewise, the $B_2O_3$ network forming oxide is advantaged over the $Al_2O_3$ and $P_2O_5$ network forming oxides to improve free volume and corresponding indentation crack resistance. Therefore, in embodiments, it may be desirable to have an increased percentage of $Na_2O$ and $B_2O_3$ in the glass composition relative to the amount of $Li_2O$, $Al_2O_3$, and $P_2O_5$. Accordingly, in one or more embodiments, $1.50 \leq (Li_2O+Al_2O_3+P_2O_5)/(Na_2O+B_2O_3) \leq 3.50$, such as $1.80 \leq (Li_2O+Al_2O_3+P_2O_5)/(Na_2O+B_2O_3) \leq 3.35$, $2.00 \leq (Li_2O+Al_2O_3+P_2O_5)/(Na_2O+B_2O_3) \leq 3.20$, $2.20 \leq (Li_2O+Al_2O_3+P_2O_5)/(Na_2O+B_2O_3) \leq 3.00$, or $2.40 \leq (Li_2O+Al_2O_3+P_2O_5)/(Na_2O+B_2O_3) \leq 2.80$, and all ranges and sub-ranges between the foregoing values.

In one or more embodiments, the amount of $Al_2O_3$ and $Li_2O$ in the glass composition may be included in the glass composition relative to other glass network formers and $Na_2O$ in an amount that increases the damage resistance of the glass without effecting the CTE and formability of the glass. Accordingly, in some embodiments, the glass composition has a relationship, in mol %, $1.00 \leq (Li_2O+Al_2O_3)/(Na_2O+B_2O_3+P_2O_5) \leq 2.75$, such as $1.25 \leq (Li_2O+Al_2O_3)/(Na_2O+B_2O_3+P_2O_5) \leq 2.50$, $1.50 \leq (Li_2O+Al_2O_3)/(Na_2O+B_2O_3+P_2O_5) \leq 2.25$, or $1.75 \leq (Li_2O+Al_2O_3)/(Na_2O+B_2O_3+P_2O_5) \leq 2.00$, and all ranges and sub-ranges between the foregoing values.

In some embodiments, the amount of $Al_2O_3$, $B_2O_3$ and $P_2O_5$ glass network forming components may be balanced against other components of the glass composition, such as, for example, $R_2O$ and RO. In some embodiments, the glass composition may have a relationship, in mol %, $1.0 < (Al_2O_3+B_2O_3+P_2O_5)/(R_2O+RO)$, such as $1.0 < (Al_2O_3+B_2O_3+P_2O_5)/(R_2O+RO) < 1.8$, $1.1 < (Al_2O_3+B_2O_3+P_2O_5)/(R_2O+RO) < 1.7$, $1.2 < (Al_2O_3+B_2O_3+P_2O_5)/(R_2O+RO) < 1.6$, or $1.3 < (Al_2O_3+B_2O_3+P_2O_5)/(R_2O+RO) < 1.5$, and all ranges and sub-ranges between the foregoing values.

In embodiments, the glass article may be substantially free of one or both of arsenic and antimony. In embodiments, the glass article may be free of one or both of arsenic and antimony.

In one embodiment, the glass composition may meet the following relationship, in mol %, $6.96Al_2O_3-1.90B_2O_3+2.16CaO+3.30MgO-1.50Na_2O+12.74Li_2O-1.10SrO-14.50K_2O-1.87La_2O_3+6.13ZrO_2-76.40 > 50.00$.

Physical properties of the alkali aluminosilicate glass compositions as disclosed above will now be discussed. These physical properties can be achieved by modifying the component amounts of the alkali aluminosilicate glass composition, as will be discussed in more detail with reference to the examples.

Glass compositions according to embodiments may have a density from greater than or equal to 2.20 g/cm³ to less than or equal to 2.50 g/cm³, such as from greater than or equal to 2.25 g/cm³ to less than or equal to 2.50 g/cm³, from greater than or equal to 2.30 g/cm³ to less than or equal to 2.50 g/cm³, from greater than or equal to 2.35 g/cm³ to less than or equal to 2.50 g/cm³, from greater than or equal to 2.40 g/cm³ to less than or equal to 2.50 g/cm³, or from greater than or equal to 2.45 g/cm³ to less than or equal to 2.50 g/cm³. In embodiments, the glass composition may have a density from greater than or equal to 2.20 g/cm³ to less than or equal to 2.45 g/cm³, such as from greater than or equal to 2.20 g/cm³ to less than or equal to 2.40 g/cm³, from greater than or equal to 2.20 g/cm³ to less than or equal to 2.35 g/cm³, from greater than or equal to 2.20 g/cm³ to less than or equal to 2.30 g/cm³, or from greater than or equal to 2.20 g/cm³ to less than or equal to 2.25 g/cm³, and all ranges and sub-ranges between the foregoing values. Generally, as larger, denser alkali metal cations, such as $Na^+$ or $K^+$, are replaced with smaller alkali metal cations, such as $Li^+$, in an alkali aluminosilicate glass composition, the density of the glass composition decreases. Accordingly, the higher the amount of lithium in the glass composition, the less dense the glass composition will be. The density values recited in this disclosure refer to a value as measured by the buoyancy method of ASTM C693-93(2013).

In embodiments, the liquidus viscosity is less than or equal to 1000 kP, such as less than or equal to 800 kP, less than or equal to 600 kP, less than or equal to 400 kP, less than or equal to 200 kP, less than or equal to 100 kP, or less than or equal to 75 kP. In embodiments, the liquidus viscosity is greater than or equal to 20 kP, such as greater than or equal to 40 kP, greater than or equal to 60 kP, greater than or equal to 80 kP, greater than or equal to 100 kP, greater than or equal to 120 kP, greater than or equal to 140 kP, or greater than or equal to 160 kP. It should be understood that, in embodiments, any of the above ranges may be combined with any other range. In embodiments, the liquidus viscosity is from greater than or equal to 20 kP to less than or equal to 1000 kP, such as greater than or equal to 40 kP to less than or equal to 900 kP, greater than or equal to 60 kP to less than or equal to 800 kP, or greater than or equal to 80 kP to less than or equal to 700 kP, and all ranges and sub-ranges between the foregoing values. The liquidus viscosity was measured according to ASTM C829-81 (2010).

The addition of lithium to the glass composition also affects the Young's modulus, shear modulus, and Poisson's ratio of the glass composition. In embodiments, the Young's modulus of a glass composition may be from greater than or equal to 65 GPa to less than or equal to 85 GPa, such as from greater than or equal to 67 GPa to less than or equal to 82 GPa, from greater than or equal to 70 GPa to less than or equal to 80 GPa, from greater than or equal to 72 GPa to less than or equal to 78 GPa, or from greater than or equal to 74 GPa to less than or equal to 76 GPa, and all ranges and sub-ranges between the foregoing values. In other embodiments, the Young's modulus of the glass composition may be from greater than or equal to 66 GPa to less than or equal to 85 GPa, such as from greater than or equal to 68 GPa to less than or equal to 85 GPa, from greater than or equal to 70 GPa to less than or equal to 85 GPa, from greater than or equal to 72 GPa to less than or equal to 85 GPa, from greater than or equal to 74 GPa to less than or equal to 85 GPa, from greater than or equal to 76 GPa to less than or equal to 85 GPa, from greater than or equal to 78 GPa to less than or equal to 85 GPa, from greater than or equal to 80 GPa to less than or equal to 85 GPa, or from greater than or equal to 82 GPa to less than or equal to 85 GPa, and all ranges and sub-ranges between the foregoing values. In embodiments, the Young's modulus may be from greater than or equal to 65 GPa to less than or equal to 84 GPa, such as from greater than or equal to 65 GPa to less than or equal to 82 GPa, from greater than or equal to 65 GPa to less than or equal to 80

GPa, from greater than or equal to 65 GPa to less than or equal to 78 GPa, from greater than or equal to 65 GPa to less than or equal to 76 GPa, from greater than or equal to 65 GPa to less than or equal to 74 GPa, from greater than or equal to 65 GPa to less than or equal to 72 GPa, from greater than or equal to 65 GPa to less than or equal to 70 GPa, from greater than or equal to 65 GPa to less than or equal to 68 GPa, or from greater than or equal to 65 GPa to less than or equal to 10 GPa, and all ranges and sub-ranges between the foregoing values. The Young's modulus values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

According to some embodiments, the glass composition may have a shear modulus of from greater than or equal to 25 GPa to less than or equal to 35 GPa, such as from greater than or equal to 26 GPa to less than or equal to 34 GPa, from greater than or equal to 27 GPa to less than or equal to 33 GPa, from greater than or equal to 28 GPa to less than or equal to 32 GPa, or from greater than or equal to 29 GPa to less than or equal to 31 GPa, and all ranges and sub-ranges between the foregoing values. In embodiments the glass composition may have a shear modulus from greater than or equal to 26 GPa to less than or equal to 35 GPa, such as from greater than or equal to 27 GPa to less than or equal to 35 GPa, from greater than or equal to 28 GPa to less than or equal to 35 GPa, from greater than or equal to 29 GPa to less than or equal to 35 GPa, from greater than or equal to 30 GPa to less than or equal to 35 GPa, from greater than or equal to 31 GPa to less than or equal to 35 GPa, from greater than or equal to 32 GPa to less than or equal to 35 GPa, from greater than or equal to 33 GPa to less than or equal to 35 GPa, or from greater than or equal to 34 GPa to less than or equal to 35 GPa, and all ranges and sub-ranges between the foregoing values. In embodiments, the glass composition may have a shear modulus from greater than or equal to 25 GPa to less than or equal to 34 GPa, such as from greater than or equal to 25 GPa to less than or equal to 33 GPa, from greater than or equal to 25 GPa to less than or equal to 32 GPa, from greater than or equal to 25 GPa to less than or equal to 31 GPa, from greater than or equal to 25 GPa to less than or equal to 30 GPa, from greater than or equal to 25 GPa to less than or equal to 29 GPa, from greater than or equal to 25 GPa to less than or equal to 28 GPa, from greater than or equal to 25 GPa to less than or equal to 27 GPa, or from greater than or equal to 25 GPa to less than or equal to 26 GPa, and all ranges and sub-ranges between the foregoing values. The shear modulus values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

From the above, glass compositions according to embodiments may be formed by any suitable method, such as slot forming, float forming, rolling processes, fusion forming processes, etc.

The glass article may be characterized by the manner in which it is formed. For instance, the glass article may be characterized as float-formable (i.e., formed by a float process), down-drawable and, in particular, fusion-formable or slot-drawable (i.e., formed by a down draw process such as a fusion draw process or a slot draw process).

Some embodiments of the glass articles described herein may be formed by a down-draw process. Down-draw processes produce glass articles having a uniform thickness that possess relatively pristine surfaces. Because the average flexural strength of the glass article is controlled by the amount and size of surface flaws, a pristine surface that has had minimal contact has a higher initial strength. In addition, down drawn glass articles have a very flat, smooth surface that can be used in its final application without costly grinding and polishing.

Some embodiments of the glass articles may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass article comes in contact with any part of the apparatus. Thus, the surface properties of the fusion drawn glass article are not affected by such contact.

Some embodiments of the glass articles described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region.

In one or more embodiments, the glass articles described herein may exhibit an amorphous microstructure and may be substantially free of crystals or crystallites. In other words, the glass articles exclude glass-ceramic materials in some embodiments.

As mentioned above, in embodiments, the alkali aluminosilicate glass compositions can be strengthened, such as by ion exchange, making a glass that is damage resistant for applications such as, but not limited to, glass for display covers. With reference to FIG. 1, the glass has a first region under compressive stress (e.g., first and second compressive layers 120, 122 in FIG. 1) extending from the surface to a depth of compression (DOC) of the glass and a second region (e.g., central region 130 in FIG. 1) under a tensile stress or central tension (CT) extending from the DOC into the central or interior region of the glass. As used herein, DOC refers to the depth at which the stress within the glass article changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, CS=|CS|. The compressive stress (CS) has a maximum at or near the surface of the glass, and the CS varies with distance d from the surface according to a function. Referring again to FIG. 1, a first segment 120 extends from first surface 110 to a depth $d_1$ and a second segment 122 extends from second surface 112 to a depth $d_2$.

Together, these segments define a compression or CS of glass 100. Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

In some embodiments, the CS is from greater than or equal to 400 MPa to less than or equal to 800 MPa, such as from greater than or equal to 425 MPa to less than or equal to 775 MPa, from greater than or equal to 450 MPa to less than or equal to 750 MPa, from greater than or equal to 475 MPa to less than or equal to 725 MPa, from greater than or equal to 500 MPa to less than or equal to 700 MPa, from greater than or equal to 525 MPa to less than or equal to 675 MPa, from greater than or equal to 550 MPa to less than or equal to 650 MPa, or from greater than or equal to 575 MPa to less than or equal to 625 MPa, and all ranges and sub-ranges between the foregoing values.

In one or more embodiments, $Na^+$ and $K^+$ ions are exchanged into the glass article and the $Na^+$ ions diffuse to a deeper depth into the glass article than the $K^+$ ions. The depth of penetration of $K^+$ ions ("Potassium DOL") is distinguished from DOC because it represents the depth of potassium penetration as a result of an ion exchange process. The Potassium DOL is typically less than the DOC for the articles described herein. Potassium DOL is measured using a surface stress meter such as the commercially available FSM-6000 surface stress meter, manufactured by Orihara Industrial Co., Ltd. (Japan), which relies on accurate measurement of the stress optical coefficient (SOC), as described above with reference to the CS measurement. The Potassium DOL of each of first and second compressive layers 120, 122 is from greater than or equal to 5 μm to less than or equal to 30 μm, such as from greater than or equal to 6 μm to less than or equal to 25 μm, from greater than or equal to 7 μm to less than or equal to 20 μm, from greater than or equal to 8 μm to less than or equal to 15 μm, or from greater than or equal to 9 μm to less than or equal to 10 μm, and all ranges and sub-ranges between the foregoing values. In embodiments, the potassium DOL of each of the first and second compressive layers 120, 122 is from greater than or equal to 6 μm to less than or equal to 30 μm, such as from greater than or equal to 10 μm to less than or equal to 30 μm, from greater than or equal to 15 μm to less than or equal to 30 μm, from greater than or equal to 20 μm to less than or equal to 30 μm, or from greater than or equal to 25 μm to less than or equal to 30 μm, and all ranges and sub-ranges between the foregoing values. In embodiments, the potassium DOL of each of the first and second compressive layers 120, 122 is from greater than or equal to 5 μm to less than or equal to 25 μm, such as from greater than or equal to 5 μm to less than or equal to 20 μm, from greater than or equal to 5 μm to less than or equal to 15 μm, or from greater than or equal to 5 μm to less than or equal to 10 μm, and all ranges and sub-ranges between the foregoing values.

The compressive stress of both major surfaces (110, 112 in FIG. 1) is balanced by stored tension in the central region (130) of the glass. The maximum central tension (CT) and DOC values are measured using a scattered light polariscope (SCALP) technique known in the art. The Refracted near-field (RNF) method or SCALP may be used to measure the stress profile. When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

In embodiments, the glass composition may have a maximum CT greater than or equal to 60 MPa, such as greater than or equal to 70 MPa, greater than or equal to 80 MPa, greater than or equal to 90 MPa, greater than or equal to 100 MPa, greater than or equal to 110 MPa, greater than or equal to 120 MPa, greater than or equal to 130 MPa, greater than or equal to 140 MPa, or greater than or equal to 150 MPa, and all ranges and sub-ranges between the foregoing values. In some embodiments, the glass composition may have a maximum CT less than or equal to 200 MPa, such as less than or equal to 190 MPa, less than or equal to 180 MPa, less than or equal to 170 MPa, less than or equal to 160 MPa, less than or equal to 150 MPa, less than or equal to 140 MPa, less than or equal to 130 MPa, less than or equal to 120 MPa, less than or equal to 110 MPa, less than or equal to 100 MPa, less than or equal to 90 MPa, or less than or equal to 80 MPa, and all ranges and sub-ranges between the foregoing values. It should be understood that, in embodiments, any of the above ranges may be combined with any other range. In embodiments, the glass composition may have a maximum CT from greater than or equal to 60 MPa to less than or equal to 200 MPa, such as from greater than or equal to 70 MPa to less than or equal to 190 MPa, from greater than or equal to 80 MPa to less than or equal to 180 MPa, from greater than or equal to 90 MPa to less than or equal to 170 MPa, from greater than or equal to 100 MPa to less than or equal to 160 MPa, from greater than or equal to 110 MPa to less than or equal to 150 MPa, or from greater than or equal to 120 MPa to less than or equal to 140 MPa, and all ranges and sub-ranges between the foregoing values.

As noted above, DOC is measured using a scattered light polariscope (SCALP) technique known in the art. The DOC is provided in some embodiments herein as a portion of the thickness (t) of the glass article. In embodiments, the glass compositions may have a depth of compression (DOC) from greater than or equal to 0.15t to less than or equal to 0.25t, such as from greater than or equal to 0.18t to less than or equal to 0.22t, or from greater than or equal to 0.19t to less than or equal to 0.21t, and all ranges and sub-ranges between the foregoing values. In embodiments, the glass composition may have a DOC from greater than or equal to 0.16t to less than or equal to 0.2t, such as from greater than or equal to 0.17t to less than or equal to 0.25t, from greater than or equal to 0.18t to less than or equal to 0.25t, from greater than or equal to 0.19t to less than or equal to 0.25t, from greater than or equal to 0.20t to less than or equal to 0.25t, from greater than or equal to 0.21t to less than or equal to 0.25t, from greater than or equal to 0.22t to less than or equal to 0.25t, from greater than or equal to 0.23t to less than or equal to 0.25t, or from greater than or equal to 0.24t to less than or equal to 0.25t, and all ranges and sub-ranges between the foregoing values. In embodiments, the glass composition may have a DOC from greater than or equal to 0.15t to less than or equal to 0.24t, such as from greater than or equal to 0.15t to less than or equal to 0.23t, from greater than or equal to 0.15t to less than or equal to 0.22t, from greater than or equal to 0.15t to less than or equal to 0.21t, from greater than or equal to 0.15t to less than or equal to 0.20t, from greater than or equal to 0.15t to less than or equal to 0.19t, from greater than or equal to 0.15t to less than or equal to 0.18t, from greater than or equal to 0.15t to less than or equal to 0.17t, or from greater than or equal to 0.15t to less than or equal to 0.16t, and all ranges and sub-ranges between the foregoing values.

Compressive stress layers may be formed in the glass by exposing the glass to an ion exchange solution. In embodiments, the ion exchange solution may be molten nitrate salt. In some embodiments, the ion exchange solution may be molten $KNO_3$, molten $NaNO_3$, or combinations thereof. In embodiments, the ion exchange solution may comprise about 90% molten $KNO_3$, about 80% molten $KNO_3$, about 70% molten $KNO_3$, about 60% molten $KNO_3$, or about 50% molten $KNO_3$. In embodiments, the ion exchange solution may comprise about 10% molten $NaNO_3$, about 20% molten $NaNO_3$, about 30% molten $NaNO_3$, or about 40% molten $NaNO_3$. In embodiments, the ion exchange solution may comprise about 80% molten $KNO_3$ and about 20% molten $NaNO_3$, about 75% molten $KNO_3$ and about 25% molten $NaNO_3$, about 70% molten $KNO_3$ and about 30% molten $NaNO_3$, about 65% molten $KNO_3$ and about 35% molten $NaNO_3$, or about 60% molten $KNO_3$ and about 40% molten $NaNO_3$, and all ranges and sub-ranges between the foregoing values. In embodiments, other sodium and potassium salts may be used in the ion exchange solution, such as, for example sodium or potassium nitrites, phosphates, or sulfates. In some embodiments, the ion exchange solution may include lithium salts, such as $LiNO_3$.

The glass composition may be exposed to the ion exchange solution by dipping a glass article made from the glass composition into a bath of the ion exchange solution, spraying the ion exchange solution onto a glass article made from the glass composition, or otherwise physically applying the ion exchange solution to a glass article made from the glass composition. Upon exposure to the glass composition, the ion exchange solution may, according to embodiments, be at a temperature from greater than or equal to 400° C. to less than or equal to 500° C., such as from greater than or equal to 410° C. to less than or equal to 490° C., from greater than or equal to 420° C. to less than or equal to 480° C., from greater than or equal to 430° C. to less than or equal to 470° C., or from greater than or equal to 440° C. to less than or equal to 460° C., and all ranges and sub-ranges between the foregoing values. In embodiments, the glass composition may be exposed to the ion exchange solution for a duration from greater than or equal to 4 hours to less than or equal to 48 hours, such as from greater than or equal to 8 hours to less than or equal to 44 hours, from greater than or equal to 12 hours to less than or equal to 40 hours, from greater than or equal to 16 hours to less than or equal to 36 hours, from greater than or equal to 20 hours to less than or equal to 32 hours, or from greater than or equal to 24 hours to less than or equal to 28 hours, and all ranges and sub-ranges between the foregoing values.

The ion exchange process may be performed in an ion exchange solution under processing conditions that provide an improved compressive stress profile as disclosed, for example, in U.S. Patent Application Publication No. 2016/0102011, which is incorporated herein by reference in its entirety.

After an ion exchange process is performed, it should be understood that a composition at the surface of a glass article may be different than the composition of the as-formed glass article (i.e., the glass article before it undergoes an ion exchange process). This results from one type of alkali metal ion in the as-formed glass, such as, for example $Li^+$ or $Na^+$, being replaced with larger alkali metal ions, such as, for example $Na^+$ or $K^+$, respectively. However, the glass composition at or near the center of the depth of the glass article will, in embodiments, still have the composition of the as-formed (non-ion exchanged) glass utilized to form the glass article.

Figure 2A:
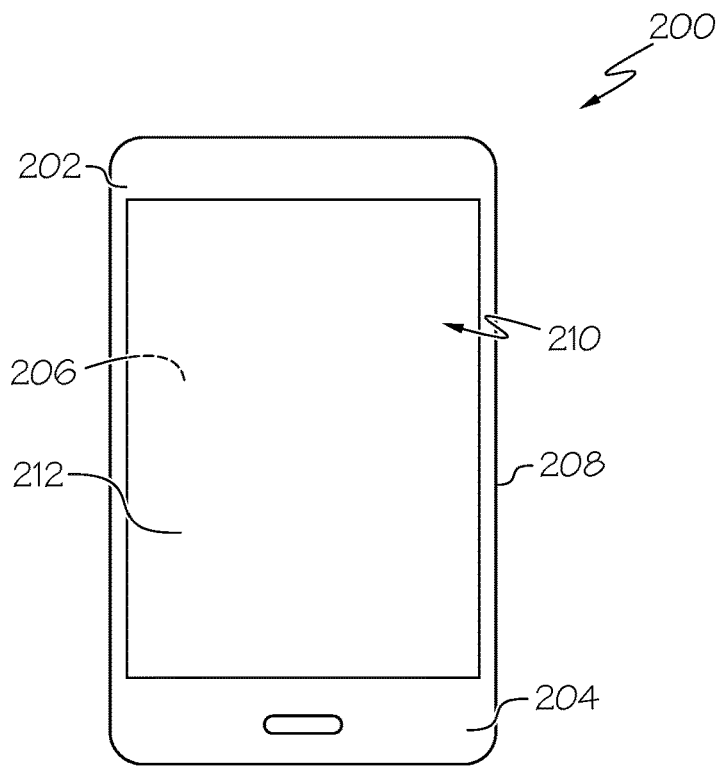
FIG. 2A is a plan view of an exemplary electronic device incorporating any of the glass articles disclosed herein.
Figure 2B:
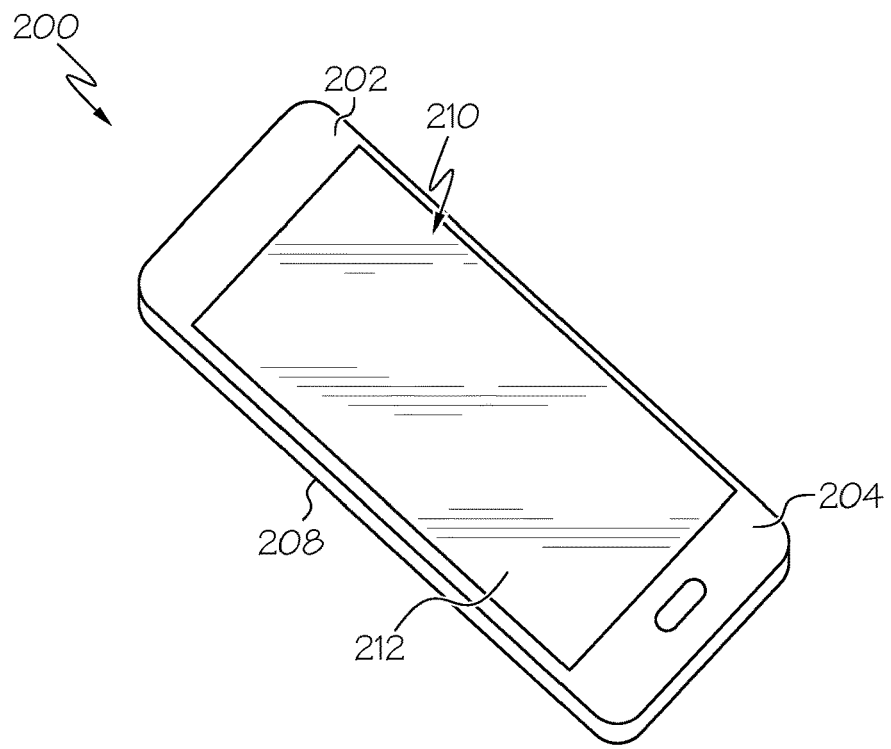
FIG. 2B is a perspective view of the exemplary electronic device of FIG. 2A.

The glass articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass articles disclosed herein is shown in FIGS. 2A and 2B. Specifically, FIGS. 2A and 2B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, a portion of the cover substrate 212 and/or a portion of the housing 202 may include any of the glass articles disclosed herein.

A first clause comprises a glass composition comprising: from greater than or equal to 55.0 mol % to less than or equal to 70.0 mol % $SiO_2$; from greater than or equal to 12.0 mol % to less than or equal to 20.0 mol % $Al_2O_3$; from greater than or equal to 5.0 mol % to less than or equal to 15.0 mol % $Li_2O$; and from greater than or equal to 4.0 mol % to less than or equal to 15.0 mol % $Na_2O$, wherein $-8.00$ mol %$\leq R_2O+RO-Al_2O_3-B_2O_3-P_2O_5 \leq -1.75$ mol %, $9.00 \leq (SiO_2+Al_2O_3+Li_2O)/Na_2O$, and $(Li_2O+Al_2O_3+P_2O_5)/(Na_2O+B_2O_3) \leq 3.50$.

A second clause comprises the glass composition of the first clause, wherein $-7.50$ mol %$\leq R_2O+RO-Al_2O_3-B_2O_3-P_2O_5 \leq -2.50$ mol %.

A third clause comprises the glass composition of any one of the first and second clauses, wherein $9.00 \leq (SiO_2+Al_2O_3+Li_2O)/Na_2O \leq 16.00$.

A fourth clause comprises the glass composition of any one of the first to third clauses, wherein $9.20 \leq (SiO_2+Al_2O_3+Li_2O)/Na_2O \leq 15.50$.

A fifth clause comprises, the glass composition of any one of the first to fourth clauses, wherein $1.50 \leq (Li_2O+Al_2O_3+P_2O_5)/(Na_2O+B_2O_3) \leq 3.50$.

A sixth clause comprises, the glass composition of any one of the first to fifth clauses, wherein $1.80 \leq (Li_2O+Al_2O_3+P_2O_5)/(Na_2O+B_2O_3) \leq 3.35$.

A seventh clause comprises, the glass composition of any one of the first to sixth clauses, wherein $B_2O_3+P_2O_5$ is greater than 0.0 mol %.

An eighth clause comprises, the glass composition of any one of the first to seventh clauses, wherein $1.00 \leq (Li_2O+Al_2O_3)/(Na_2O+B_2O_3+P_2O_5) \leq 2.75$.

A ninth clause comprises, the glass composition of any one of the first to eighth clauses, wherein $Al_2O_3+Li_2O$ is greater than 21.4 mol %.

A tenth clause comprises, the glass composition of any one of the first to ninth clauses, where $Al_2O_3+Li_2O+Na_2O$ is greater than 25.0 mol %.

An eleventh clause comprises, the glass composition of any one of the first to tenth clauses, wherein $0.90<Al_2O_3/(R_2O+RO)<1.20$.

A twelfth clause comprises, the glass composition of any one of the first to eleventh clauses, wherein $1.0<(Al_2O_3+B_2O_3+P_2O_5)/(R_2O+RO)$.

A thirteenth clause comprises, the glass composition of any one of the first to twelfth clauses, wherein $6.96Al_2O_3-1.90B_2O_3+2.16CaO+3.30MgO-1.50Na_2O+12.74Li_2O-1.10SrO-14.50K_2O-1.87La_2O_3+6.13ZrO_2-76.40$ mol %>50.00 mol %.

A fourteenth clause comprises a glass article comprising: a first surface; a second surface opposite the first surface, wherein a thickness (t) of the glass article is measured as a distance between the first surface and the second surface; and a compressive stress layer extending from at least one of the first surface and the second surface into the thickness (t) of the glass article, wherein a central tension of the glass article is greater than or equal to 60 MPa, the compressive stress layer has a depth of compression that is from greater than or equal to 0.15t to less than or equal to 0.25t, and the glass article is formed from a glass comprising: from greater than or equal to 55.0 mol % to less than or equal to 70.0 mol % $SiO_2$; from greater than or equal to 12.0 mol % to less than or equal to 20.0 mol % $Al_2O_3$; from greater than or equal to 5.0 mol % to less than or equal to 15.0 mol % $Li_2O$; and from greater than or equal to 4.0 mol % to less than or equal to 15.0 mol % $Na_2O$, wherein $-8.00$ mol % $\leq R_2O+RO-Al_2O_3-B_2O_3-P_2O_5 \leq -1.75$ mol %, $9.00 \leq (SiO_2+Al_2O_3+Li_2O)/Na_2O$, and $(Li_2O+Al_2O_3+P_2O_5)/(Na_2O+B_2O_3) \leq 3.50$.

A fifteenth clause comprises the glass article of the fourteenth clause, wherein the central tension of the glass article is greater than or equal to 80 MPa.

A sixteenth clause comprises the glass article of any one of the fourteenth and fifteenth clauses, wherein the central tension of the glass article is greater than or equal to 90 MPa.

A seventeenth clause comprises the glass article of any one of the fourteenth to sixteenth clauses, wherein the compressive stress layer has a depth of compression that is from greater than or equal to 0.18t to less than or equal to 0.22t.

An eighteenth clause comprises the glass article of any one of the fourteenth to seventeenth clauses, wherein the glass article has a liquidus viscosity from greater than or equal to 20 kP to less than 1000 kP.

A nineteenth clause comprises a consumer electronic product, comprising: a housing comprising a front surface, a back surface and side surfaces; electrical components at least partially within the housing, the electrical components comprising at least a controller, a memory, and a display, the display at or adjacent the front surface of the housing; and a cover substrate disposed over the display, wherein at least a portion of at least one of the housing and the cover substrate comprises the glass article of any one of the fourteenth to eighteenth clauses.

A twentieth clause comprises a glass article comprising: a first surface; a second surface opposite the first surface, wherein a thickness (t) of the glass article is measured as a distance between the first surface and the second surface; and a compressive stress layer extending from at least one of the first surface and the second surface into the thickness (t) of the glass article, wherein a central tension of the glass article is greater than or equal to 60 MPa, the compressive stress layer has a depth of compression that is from greater than or equal to 0.15t to less than or equal to 0.25t, and the glass article has a composition at the center depth of the glass article comprising: from greater than or equal to 55.0 mol % to less than or equal to 70.0 mol % $SiO_2$; from greater than or equal to 12.0 mol % to less than or equal to 20.0 mol % $Al_2O_3$; from greater than or equal to 5.0 mol % to less than or equal to 15.0 mol % $Li_2O$; and from greater than or equal to 4.0 mol % to less than or equal to 15.0 mol % $Na_2O$, wherein $-8.00$ mol % $\leq R_2O+RO-Al_2O_3-B_2O_3-P_2O_5 \leq -1.75$ mol %, $9.00 \leq (SiO_2+Al_2O_3+Li_2O)/Na_2O$, and $(Li_2O+Al_2O_3+P_2O_5)/(Na_2O+B_2O_3) \leq 3.50$.

A twenty first clause comprises a glass composition comprising: from greater than or equal to 60.0 mol % to less than or equal to 70.0 mol % $SiO_2$; greater than or equal to 12.0 mol % to less than or equal to 18.0 mol % $Al_2O_3$; greater than or equal to 5.0 mol % to less than or equal to 10.0 mol % $Li_2O$; greater than or equal to 4.0 mol % to less than or equal to 10.0 mol % $Na_2O$; and greater than or equal to 0.75 mol % $P_2O_5$, wherein $Li_2O/Na_2O$ greater than or equal to 1.00, and $Al_2O_3+Li_2O$ less than or equal to 25.25 mol %.

A twenty second clause comprises a glass article comprising: a first surface; a second surface opposite the first surface, wherein a thickness (t) of the glass article is measured as a distance between the first surface and the second surface; and a compressive stress layer extending from at least one of the first surface and the second surface into the thickness (t) of the glass article, wherein a central tension of the glass article is greater than or equal to 60 MPa, the compressive stress layer has a depth of compression that is from greater than or equal to 0.15t to less than or equal to 0.25t, and the glass article is formed from a glass according to the twenty first clause.

A twenty third clause comprises the glass article of the twenty second clause, wherein the central tension of the glass article is greater than or equal to 80 MPa.

A twenty fourth clause comprises the glass article of any one of the twenty second and twenty third clauses, wherein the central tension of the glass article is greater than or equal to 90 MPa.

A twenty fifth clause comprises the glass article of any one of the twenty second to twenty fourth clauses, wherein the compressive stress layer has a depth of compression that is from greater than or equal to 0.18t to less than or equal to 0.22t.

A twenty sixth clause comprises the glass article of any one of the twenty second to twenty fifth clauses, wherein the glass has a liquidus viscosity from greater than or equal to 20 kP to less than 1000 kP.

A twenty seventh clause comprises a consumer electronic product, comprising: a housing comprising a front surface, a back surface and side surfaces; electrical components at least partially within the housing, the electrical components comprising at least a controller, a memory, and a display, the display at or adjacent the front surface of the housing; and a cover substrate disposed over the display, wherein at least a portion of at least one of the housing and the cover substrate comprises the glass article of any one of the twenty second to twenty sixth clauses.

EXAMPLES

Embodiments will be further clarified by the following examples. It should be understood that these examples are not limiting to the embodiments described above.

Glass compositions having components listed in Table 1 below were prepared by conventional glass forming methods. In Table 1, all components are in mol %, and various properties of the glass compositions were measured according to the methods disclosed in this specification.

TABLE 1

|  | Sample | | | |
| --- | --- | --- | --- | --- |
|  | 1 | 2 | 3 | 4 |
| $SiO_2$ | 64.94 | 63.55 | 63.22 | 61.97 |
| $Al_2O_3$ | 16.26 | 16.12 | 16.09 | 15.69 |
| $Li_2O$ | 7.67 | 7.18 | 7.20 | 7.01 |
| $Na_2O$ | 7.94 | 9.34 | 9.26 | 9.11 |
| $K_2O$ | | | | |
| MgO | 0.51 | 0.22 | 0.21 | 0.21 |
| ZnO | | | | |
| CaO | | | | |
| SrO | | | | |
| $B_2O_3$ | 0.00 | 0.94 | 1.37 | 3.47 |
| $P_2O_5$ | 2.46 | 2.47 | 2.46 | 2.37 |
| $SnO_2$ | 0.05 | 0.05 | 0.05 | 0.05 |
| Sum | 100 | 100 | 100 | 100 |
| $Al_2O_3/(R_2O + RO)$ | 1.01 | 0.96 | 0.97 | 0.96 |
| $Al_2O_3 + Li_2O$ | 23.93 | 23.30 | 23.29 | 22.70 |
| $Na_2O + Li_2O + Al_2O_3 + RO$ | 32.38 | 32.86 | 32.76 | 32.02 |
| $Al_2O_3 + MgO + ZnO$ | 16.77 | 16.34 | 16.30 | 15.90 |
| $Al_2O_3 + B_2O_3$ | 16.26 | 17.06 | 17.46 | 19.16 |
| $(Al_2O_3 + B_2O_3 + P_2O_5)/(R_2O + RO)$ | 1.16 | 1.17 | 1.19 | 1.32 |
| VFT Viscosity Coefficients | | | | |
| A | −3.66 | −3.55 | −3.41 | −3.18 |
| B | 9500.8 | 9429.9 | 9138.3 | 8488.6 |
| To | 67.7 | 14.9 | 38.2 | 40.2 |
| Temps at Fixed Viscosities (P) | | | | |
| 200 | 1661 | 1628 | 1638 | 1589 |
| 35000 | 1226 | 1181 | 1187 | 1139 |
| 200000 | 1128 | 1081 | 1087 | 1041 |
| $10^{11}$ Poise Temperature (° C.) | | | | |
| Density (g/cm³) | 2.400 | 2.402 | 2.400 | 2.389 |
| CTE (*10⁻⁷ (1/° C.)) | 70.6 | 76.7 | 75.7 | 75.1 |
| Fiber Elongation Strain Point (° C.) | 606 | 569 | 565 | 530 |
| Fiber Elongation Annealing Point (° C.) | 661 | 622 | 616 | 580 |
| Fiber Elongation Softening Point (° C.) | 926.4 | 884.5 | 877.9 | 832.5 |
| Beam Bending Viscosity Strain Point (° C.) | | | | |
| Beam Bending Viscosity Annealing Point (° C.) | | | | |
| Beam Bending Viscosity Softening Point (° C.) | | | | |
| Liquidus Temperature (° C.) - Internal | 1105 | 1060 | 1080 | 1015 |
| Liquidus - Primary Phase | Spodumene | Spodumene | Spodumene | Spodumene |
| Liquidus Viscosity (kP) - Internal | 315 | 301 | 230 | 338 |
| Measured Zircon Breakdown Temperature (° C.) | 1270 | | | |
| Stress Optical Coefficient (nm/mm/MPa) | 3.002 | 3.012 | 3.046 | 3.121 |
| Refractive Index | 1.5041 | 1.5034 | 1.5030 | 1.5030 |
| Poissons Ratio | 0.213 | | | |
| E (Young's Modulus, GPa) | 77.8 | | | |
| G (Shear Modulus, GPa) | 32.1 | | | |
| *fibers cerammed | | | | |
| IOX | | | | |
| Max CT (Mpa) | 88.5 | 80.8 | 82.6 | 81.1 |
| K % for IOX | 80 | 80 | 80 | 80 |
| DOL (um) | 13.9 | 18.9 | 20.0 | 15.5 |
| CS (Mpa) | 623 | 627 | 622 | 610 |

|  | Sample | | | |
| --- | --- | --- | --- | --- |
|  | 5 | 6 | 7 | 8 |
| $SiO_2$ | 61.15 | 63.08 | 63.74 | 63.66 |
| $Al_2O_3$ | 15.49 | 15.98 | 16.83 | 16.53 |
| $Li_2O$ | 6.87 | 7.06 | 7.46 | 7.38 |
| $Na_2O$ | 9.01 | 9.27 | 9.24 | 8.17 |

TABLE 1-continued

|  | 5 | 6 | 7 | 8 |
|---|---|---|---|---|
| K₂O |  |  |  |  |
| MgO | 0.22 | 0.22 |  | 0.22 |
| ZnO |  |  |  |  |
| CaO |  |  |  | 0.33 |
| SrO |  |  |  | 0.20 |
| B₂O₃ | 4.72 | 1.36 |  | 1.35 |
| P₂O₅ | 2.36 | 2.86 | 2.50 | 2.01 |
| SnO₂ | 0.05 | 0.05 | 0.05 | 0.04 |
| Sum | 100 | 100 | 100 | 100 |
| Al₂O₃/(R₂O + RO) | 0.96 | 0.97 | 1.01 | 1.01 |
| Al₂O₃ + Li₂O | 22.36 | 23.04 | 24.29 | 23.91 |
| Na₂O + Li₂O + Al₂O₃ + RO | 31.59 | 32.53 | 33.53 | 32.83 |
| Al₂O₃ + MgO + ZnO | 15.71 | 16.20 | 16.83 | 16.75 |
| Al₂O₃ + B₂O₃ | 20.21 | 17.34 | 16.83 | 17.88 |
| (Al₂O₃ + B₂O₃ + P₂O₅)/(R₂O + RO) | 1.40 | 1.22 | 1.16 | 1.22 |
| VFT Viscosity Coefficients |  |  |  |  |
| A | −3.31 | −3.32 | −3.34 | −3.24 |
| B | 8868.2 | 8814.9 | 8646.9 | 8372.7 |
| To | −9.5 | 63.0 | 126.2 | 122.8 |
| Temps at Fixed Viscosities (P) |  |  |  |  |
| 200 | 1572 | 1631 | 1659 | 1634 |
| 35000 | 1120 | 1184 | 1223 | 1198 |
| 200000 | 1021 | 1085 | 1127 | 1103 |
| 10¹¹ Poise Temperature (° C.) |  |  |  |  |
| Density (g/cm³) | 2.383 | 2.398 | 2.407 | 2.405 |
| CTE (*10⁻⁷ (1/° C.)) | 73.9 | 75.5 | 76 | 70.9 |
| Fiber Elongation Strain Point (° C.) | 516 | 561 | 608 | 585 |
| Fiber Elongation Annealing Point (° C.) | 564 | 613 | 661 | 638 |
| Fiber Elongation Softening Point (° C.) | 813.7 | 878.0 | 924.0 | 897.8 |
| Beam Bending Viscosity Strain Point (° C.) |  |  |  |  |
| Beam Bending Viscosity Annealing Point (° C.) |  |  |  |  |
| Beam Bending Viscosity Softening Point (° C.) |  |  |  |  |
| Liquidus Temperature (° C.) - Internal | 985 | 1050 | 1095 | 1080 |
| Liquidus - Primary Phase | Spodumene | Spodumene | Spodumene | Spodumene |
| Liquidus Viscosity (kP) - Internal | 409 | 408 | 384 | 321 |
| Measured Zircon Breakdown Temperature (° C.) | 1250 | 1260 |  |  |
| Stress Optical Coefficient (nm/mm/MPa) | 3.172 | 3.065 | 3.010 | 3.057 |
| Refractive Index | 1.5023 | 1.5013 | 1.5044 | 1.5055 |
| Poissons Ratio |  |  | 0.211 | 0.218 |
| E (Young's Modulus, GPa) |  |  | 77.4 | 77.2 |
| G (Shear Modulus, GPa) |  |  | 32.0 | 31.7 |
| *fibers cerammed |  |  |  |  |
| IOX |  |  |  |  |
| Max CT (Mpa) | 75.4 | 77.2 | 70.0 | 78.0 |
| K % for IOX | 80 | 80 | 80 | 80 |
| DOL (um) | 13.8 | 19.2 |  |  |
| CS (Mpa) | 591 | 628 |  |  |

|  | Sample | | | |
|---|---|---|---|---|
|  | 9 | 10 | 11 | 12 |
| SiO₂ | 63.65 | 62.69 | 62.75 | 62.89 |
| Al₂O₃ | 16.20 | 16.01 | 15.82 | 15.42 |
| Li₂O | 7.32 | 6.86 | 6.93 | 6.91 |
| Na₂O | 7.12 | 8.58 | 7.60 | 5.78 |
| K₂O |  |  |  |  |
| MgO | 0.41 |  | 0.22 | 0.61 |
| ZnO |  |  |  |  |
| CaO | 0.62 |  | 0.33 | 0.91 |
| SrO | 0.41 |  | 0.21 | 0.61 |
| B₂O₃ | 2.60 | 3.18 | 4.04 | 5.72 |
| P₂O₅ | 1.52 | 2.45 | 1.97 | 1.01 |
| SnO₂ | 0.04 | 0.04 | 0.04 | 0.04 |
| Sum | 100 | 100 | 100 | 100 |
| Al₂O₃/(R₂O + RO) | 1.02 | 1.04 | 1.04 | 1.04 |
| Al₂O₃ + Li₂O | 23.52 | 22.87 | 22.75 | 22.34 |
| Na₂O + Li₂O + Al₂O₃ + RO | 32.09 | 31.45 | 31.10 | 30.24 |
| Al₂O₃ + MgO + ZnO | 16.62 | 16.01 | 16.04 | 16.03 |
| Al₂O₃ + B₂O₃ | 18.80 | 19.19 | 19.86 | 21.14 |
| (Al₂O₃ + B₂O₃ + P₂O₅)/(R₂O + RO) | 1.28 | 1.40 | 1.43 | 1.49 |
| VFT Viscosity Coefficients |  |  |  |  |
| A | −3.12 | −3.66 | −3.69 | −3.22 |
| B | 8031.5 | 9526.4 | 9520.6 | 8130.5 |
| To | 129.2 | 20.4 | 15.6 | 99.2 |

TABLE 1-continued

| Temps at Fixed Viscosities (P) | | | | |
|---|---|---|---|---|
| 200 | 1610 | 1618 | 1606 | 1573 |
| 35000 | 1177 | 1181 | 1173 | 1147 |
| 200000 | 1083 | 1083 | 1075 | 1054 |
| $10^{11}$ Poise Temperature (° C.) | | | | |
| Density (g/cm³) | 2.403 | 2.384 | 2.386 | 2.392 |
| CTE (*$10^{-7}$ (1/° C.)) | 66.5 | 72.4 | 68.7 | 60.6 |
| Fiber Elongation Strain Point (° C.) | 572 | 550 | 552 | 555 |
| Fiber Elongation Annealing Point (° C.) | 624 | 603 | 604 | 607 |
| Fiber Elongation Softening Point (° C.) | | 868.9 | 863.3 | 855.4 |
| Beam Bending Viscosity Strain Point (° C.) | | | | |
| Beam Bending Viscosity Annealing Point (° C.) | | | | |
| Beam Bending Viscosity Softening Point (° C.) | | | | |
| Liquidus Temperature (° C.) - Internal | 1095 | 1040 | 1050 | 1050 |
| Liquidus - Primary Phase | Spodumene | Spodumene | Spodumene | Spodumene |
| Liquidus Viscosity (kP) - Internal | 156 | 480 | 330 | 216 |
| Measured Zircon Breakdown Temperature (° C.) | | | | |
| Stress Optical Coefficient (nm/mm/MPa) | 3.076 | 3.153 | 3.176 | 3.165 |
| Refractive Index | 1.5068 | 1.5017 | 1.5034 | 1.5073 |
| Poissons Ratio | 0.218 | 0.213 | 0.215 | 0.218 |
| E (Young's Modulus, GPa) | 76.8 | 73.8 | 74.3 | 75.7 |
| G (Shear Modulus, GPa) | 31.6 | 30.5 | 30.6 | 31.1 |
| *fibers cerammed | | | | |
| IOX | | | | |
| Max CT (Mpa) | 94.7 | 71.0 | 73.0 | 90.7 |
| K % for IOX | 60 | 80 | 80 | 60 |
| DOL (um) | | | | |
| CS (Mpa) | | | | |

| | Sample | | | |
|---|---|---|---|---|
| | 13 | 14 | 15 | 16 |
| SiO₂ | 62.67 | 62.75 | 62.72 | 62.73 |
| Al₂O₃ | 15.99 | 15.68 | 15.70 | 15.70 |
| Li₂O | 6.83 | 6.79 | 6.80 | 6.80 |
| Na₂O | 8.93 | 9.23 | 8.91 | 8.94 |
| K₂O | | | | |
| MgO | | | 0.32 | |
| ZnO | | | | 0.30 |
| CaO | | | | |
| SrO | | | | |
| B₂O₃ | 2.89 | 2.91 | 2.90 | 2.89 |
| P₂O₅ | 2.48 | 2.45 | 2.47 | 2.44 |
| SnO₂ | 0.05 | 0.05 | 0.05 | 0.05 |
| Sum | 100 | 100 | 100 | 100 |
| Al₂O₃/(R₂O + RO) | 1.01 | 0.98 | 0.98 | 0.98 |
| Al₂O₃ + Li₂O | 22.82 | 22.47 | 22.50 | 22.50 |
| Na₂O + Li₂O + Al₂O₃ + RO | 31.75 | 31.70 | 31.73 | 31.74 |
| Al₂O₃ + MgO + ZnO | 15.99 | 15.68 | 16.02 | 16.00 |
| Al₂O₃ + B₂O₃ | 18.88 | 18.58 | 18.60 | 18.59 |
| (Al₂O₃ + B₂O₃ + P₂O₅)/(R₂O + RO) | 1.36 | 1.31 | 1.31 | 1.31 |
| VFT Viscosity Coefficients | | | | |
| A | −3.13 | −3.54 | −3.60 | −3.65 |
| B | 8356.9 | 9466.9 | 9566.8 | 9754 |
| To | 85.6 | −3.7 | −7.0 | −28.0 |
| Temps at Fixed Viscosities (P) | | | | |
| 200 | 1626 | 1618 | 1613 | 1611 |
| 35000 | 1175 | 1168 | 1167 | 1162 |
| 200000 | 1077 | 1067 | 1067 | 1062 |
| $10^{11}$ Poise Temperature (° C.) | | | | |
| Density (g/cm³) | 2.386 | 2.388 | 2.389 | 2.392 |
| CTE (*$10^{-7}$ (1/° C.)) | 73.2 | 75 | 73.5 | 74 |
| Fiber Elongation Strain Point (° C.) | 552 | 549 | 549 | 540 |
| Fiber Elongation Annealing Point (° C.) | 603 | 598 | 598 | 590 |
| Fiber Elongation Softening Point (° C.) | 863.6 | 856.7 | 856.1 | 848.6 |
| Beam Bending Viscosity Strain Point (° C.) | | | | |
| Beam Bending Viscosity Annealing Point (° C.) | | | | |
| Beam Bending Viscosity Softening Point (° C.) | | | | |
| Liquidus Temperature (° C.) - Internal | 1045 | 1030 | 1020 | 1020 |
| Liquidus - Primary Phase | Spodumene | Spodumene | Spodumene | Spodumene |
| Liquidus Viscosity (kP) - Internal | 385 | 417 | 514 | 453 |
| Measured Zircon Breakdown Temperature (° C.) | | | | |
| Stress Optical Coefficient (nm/mm/MPa) | 3.175 | 3.135 | 3.118 | 3.150 |
| Refractive Index | 1.5020 | 1.5023 | 1.5026 | 1.5029 |
| Poissons Ratio | 0.212 | 0.215 | 0.216 | 0.210 |

TABLE 1-continued

|  | | | | |
|---|---|---|---|---|
| E (Young's Modulus, GPa) | 73.7 | 73.7 | 74.1 | 73.8 |
| G (Shear Modulus, GPa) | 30.4 | 30.3 | 30.5 | 30.5 |
| *fibers cerammed | | | | |
| IOX | | | | |
| Max CT (Mpa) | 67.9 | 69.2 | 72.7 | 63.1 |
| K % for IOX | 80 | 80 | 80 | 80 |
| DOL (um) | 8.5 | 12.2 | 11.4 | 8.4 |
| CS (Mpa) | 612 | 596 | 602 | 600 |

| | Sample | | | |
|---|---|---|---|---|
|  | 17 | 18 | 19 | 20 |
| $SiO_2$ | 62.78 | 62.70 | 63.46 | 63.42 |
| $Al_2O_3$ | 15.41 | 15.39 | 15.32 | 15.23 |
| $Li_2O$ | 6.79 | 6.84 | 6.43 | 6.63 |
| $Na_2O$ | 9.20 | 9.23 | 8.26 | 6.94 |
| $K_2O$ | | | | |
| MgO | 0.32 | | 0.41 | 0.60 |
| ZnO | | 0.29 | 0.68 | 0.46 |
| CaO | | | 0.62 | 0.92 |
| SrO | | | 0.41 | 0.60 |
| $B_2O_3$ | 2.87 | 2.89 | 2.79 | 4.09 |
| $P_2O_5$ | 2.45 | 2.46 | 1.48 | 0.99 |
| $SnO_2$ | 0.05 | 0.05 | 0.04 | 0.03 |
| Sum | 100 | 100 | 100 | 100 |
| $Al_2O_3/(R_2O + RO)$ | 0.94 | 0.94 | 0.91 | 0.94 |
| $Al_2O_3 + Li_2O$ | 22.20 | 22.23 | 21.75 | 21.86 |
| $Na_2O + Li_2O + Al_2O_3 + RO$ | 31.72 | 31.75 | 32.13 | 31.37 |
| $Al_2O_3 + MgO + ZnO$ | 15.73 | 15.68 | 16.42 | 16.28 |
| $Al_2O_3 + B_2O_3$ | 18.28 | 18.28 | 18.11 | 19.32 |
| $(Al_2O_3 + B_2O_3 + P_2O_5)/(R_2O + RO)$ | 1.27 | 1.27 | 1.17 | 1.26 |
| VFT Viscosity Coefficients | | | | |
| A | −4.02 | −2.78 | −4.02 | −2.78 |
| B | 10772.8 | 7764.8 | 10772.8 | 7764.8 |
| To | −98.8 | 94.6 | −98.8 | 94.6 |
| Temps at Fixed Viscosities (P) | | | | |
| 200 | 1606 | 1622 | 1606 | 1622 |
| 35000 | 1160 | 1154 | 1160 | 1154 |
| 200000 | 1057 | 1055 | 1057 | 1055 |
| $10^{11}$ Poise Temperature (° C.) | | | | |
| Density (g/cm³) | 2.391 | 2.395 | 2.391 | 2.395 |
| CTE (*$10^{-7}$ (1/° C.)) | 75 | 74.6 | 75 | 74.6 |
| Fiber Elongation Strain Point (° C.) | 538 | 538 | 538 | 538 |
| Fiber Elongation Annealing Point (° C.) | 586 | 586 | 586 | 586 |
| Fiber Elongation Softening Point (° C.) | 843.3 | 841.2 | 843.3 | 841.2 |
| Beam Bending Viscosity Strain Point (° C.) | | | | |
| Beam Bending Viscosity Annealing Point (° C.) | | | | |
| Beam Bending Viscosity Softening Point (° C.) | | | | |
| Liquidus Temperature (° C.) - Internal | 1015 | 1015 | 1015 | 1015 |
| Liquidus - Primary Phase | Spodumene | Spodumene | Spodumene | Spodumene |
| Liquidus Viscosity (kP) - Internal | 452 | 449 | 452 | 449 |
| Measured Zircon Breakdown Temperature (° C.) | | | | |
| Stress Optical Coefficient (nm/mm/MPa) | 3.127 | 3.137 | 3.127 | 3.137 |
| Refractive Index | 1.5026 | 1.5028 | 1.5026 | 1.5028 |
| Poissons Ratio | 0.217 | 0.214 | 0.217 | 0.214 |
| E (Young's Modulus, GPa) | 74.1 | 73.9 | 74.1 | 73.9 |
| G (Shear Modulus, GPa) | 30.5 | 30.4 | 30.5 | 30.4 |
| *fibers cerammed | | | | |
| IOX | | | | |
| Max CT (Mpa) | 66.7 | 70.1 | 66.7 | 70.1 |
| K % for IOX | 80 | 80 | 80 | 80 |
| DOL (um) | 8.5 | 11.9 | 8.5 | 11.9 |
| CS (Mpa) | 601 | 580 | 601 | 580 |

| | Sample | | | |
|---|---|---|---|---|
|  | 21 | 22 | 23 | 24 |
| $SiO_2$ | 63.50 | 63.56 | 65.31 | 64.75 |
| $Al_2O_3$ | 15.12 | 15.03 | 15.36 | 15.34 |
| $Li_2O$ | 6.69 | 6.46 | 7.14 | 7.19 |
| $Na_2O$ | 5.63 | 6.22 | 8.07 | 8.09 |
| $K_2O$ | | | | |
| MgO | 0.79 | 0.59 | 0.23 | 0.23 |
| ZnO | 0.23 | 0.46 | | |
| CaO | 1.22 | 0.93 | 0.36 | 0.36 |

TABLE 1-continued

|  |  |  |  |  |
|---|---|---|---|---|
| SrO | 0.81 | 0.60 | 0.21 | 0.21 |
| $B_2O_3$ | 5.40 | 5.05 | 1.20 | 1.20 |
| $P_2O_5$ | 0.51 | 0.99 | 1.99 | 2.48 |
| $SnO_2$ | 0.03 | 0.04 | 0.04 | 0.04 |
| Sum | 100 | 100 | 100 | 100 |
| $Al_2O_3/(R_2O + RO)$ | 0.98 | 0.99 | 0.96 | 0.95 |
| $Al_2O_3 + Li_2O$ | 21.81 | 21.48 | 22.50 | 22.53 |
| $Na_2O + Li_2O + Al_2O_3 + RO$ | 30.48 | 30.28 | 31.36 | 31.42 |
| $Al_2O_3 + MgO + ZnO$ | 16.13 | 16.07 | 15.59 | 15.57 |
| $Al_2O_3 + B_2O_3$ | 20.52 | 20.07 | 16.56 | 16.54 |
| $(Al_2O_3 + B_2O_3 + P_2O_5)/(R_2O + RO)$ | 1.37 | 1.38 | 1.16 | 1.18 |
| VFT Viscosity Coefficients |  |  |  |  |
| A | −3.27 | −3.08 | −3.43 | −3.65 |
| B | 8264.6 | 7920.8 | 9196.3 | 9772.5 |
| To | 76.4 | 100.2 | 53.5 | 11.1 |
| Temps at Fixed Viscosities (P) |  |  |  |  |
| 200 | 1560 | 1573 | 1658 | 1654 |
| 35000 | 1134 | 1140 | 1207 | 1204 |
| 200000 | 1041 | 1046 | 1107 | 1103 |
| $10^{11}$ Poise Temperature (° C.) |  |  |  |  |
| Density (g/cm³) | 2.407 | 2.402 | 2.400 | 2.398 |
| CTE (*$10^{-7}$ (1/° C.)) | 60.2 | 61.1 | 70.8 | 71.3 |
| Fiber Elongation Strain Point (° C.) | 550 | 549 | 575 | 575 |
| Fiber Elongation Annealing Point (° C.) | 599 | 598 | 629 | 628 |
| Fiber Elongation Softening Point (° C.) | 840.0 | 844.6 | 895.6 | 893.5 |
| Beam Bending Viscosity Strain Point (° C.) |  |  |  |  |
| Beam Bending Viscosity Annealing Point (° C.) |  |  |  |  |
| Beam Bending Viscosity Softening Point (° C.) |  |  |  |  |
| Liquidus Temperature (° C.) - Internal | 1055 | 1045 | 1085 | 1080 |
| Liquidus - Primary Phase | Spodumene | Spodumene | Spodumene | Spodumene |
| Liquidus Viscosity (kP) - Internal | 150 | 203 | 307 | 313 |
| Measured Zircon Breakdown Temperature (° C.) |  |  |  |  |
| Stress Optical Coefficient (nm/mm/MPa) | 3.177 | 3.199 | 3.054 | 3.063 |
| Refractive Index | 1.5101 | 1.5080 | 1.5040 | 1.5036 |
| Poissons Ratio | 0.218 | 0.221 | 0.210 | 0.210 |
| E (Young's Modulus, GPa) | 75.9 | 75.5 | 76.4 | 76.0 |
| G (Shear Modulus, GPa) | 31.1 | 30.9 | 31.6 | 31.4 |
| *fibers cerammed |  |  |  |  |
| IOX |  |  |  |  |
| Max CT (Mpa) |  |  | 75.8 | 71.4 |
| K % for IOX |  |  | 80 | 80 |
| DOL (um) |  |  | 14.3 | 15 |
| CS (Mpa) |  |  | 641 | 625 |

|  | Sample | | | |
|---|---|---|---|---|
|  | 25 | 26 | 27 | 28 |
| $SiO_2$ | 64.27 | 65.34 | 64.78 | 64.33 |
| $Al_2O_3$ | 15.35 | 15.37 | 15.35 | 15.35 |
| $Li_2O$ | 7.16 | 7.12 | 7.18 | 7.14 |
| $Na_2O$ | 8.13 | 7.68 | 7.72 | 7.74 |
| $K_2O$ |  |  |  |  |
| MgO | 0.23 | 0.24 | 0.23 | 0.23 |
| ZnO |  |  |  |  |
| CaO | 0.36 | 0.36 | 0.36 | 0.36 |
| SrO | 0.21 | 0.21 | 0.21 | 0.21 |
| $B_2O_3$ | 1.19 | 1.20 | 1.20 | 1.18 |
| $P_2O_5$ | 2.97 | 1.99 | 2.48 | 2.97 |
| $SnO_2$ | 0.04 | 0.04 | 0.04 | 0.04 |
| Sum | 100 | 100 | 100 | 100 |
| $Al_2O_3/(R_2O + RO)$ | 0.95 | 0.98 | 0.98 | 0.98 |
| $Al_2O_3 + Li_2O$ | 22.51 | 22.49 | 22.53 | 22.49 |
| $Na_2O + Li_2O + Al_2O_3 + RO$ | 31.44 | 30.98 | 31.05 | 31.03 |
| $Al_2O_3 + MgO + ZnO$ | 15.58 | 15.61 | 15.58 | 15.58 |
| $Al_2O_3 + B_2O_3$ | 16.53 | 16.57 | 16.55 | 16.53 |
| $(Al_2O_3 + B_2O_3 + P_2O_5)/(R_2O + RO)$ | 1.21 | 1.19 | 1.21 | 1.24 |
| VFT Viscosity Coefficients |  |  |  |  |
| A | −3.55 | −3.39 | −3.92 | −3.60 |
| B | 9513.8 | 9158.6 | 10489.9 | 9622.5 |
| To | 22.0 | 55.1 | −33.9 | 19.7 |
| Temps at Fixed Viscosities (P) |  |  |  |  |
| 200 | 1647 | 1664 | 1652 | 1651 |
| 35000 | 1197 | 1209 | 1205 | 1202 |

TABLE 1-continued

| | | | | |
|---|---|---|---|---|
| 200000 | 1097 | 1109 | 1104 | 1101 |
| $10^{11}$ Poise Temperature (° C.) | | | | |
| Density (g/cm³) | 2.397 | 2.399 | 2.396 | 2.395 |
| CTE (*$10^{-7}$ (1/° C.)) | 70.4 | 71.1 | 71.5 | 71.5 |
| Fiber Elongation Strain Point (° C.) | 566 | 578 | 569 | 563 |
| Fiber Elongation Annealing Point (° C.) | 618 | 631 | 621 | 616 |
| Fiber Elongation Softening Point (° C.) | 883.9 | 897.6 | 890.2 | 883.0 |
| Beam Bending Viscosity Strain Point (° C.) | | | | |
| Beam Bending Viscosity Annealing Point (° C.) | | | | |
| Beam Bending Viscosity Softening Point (° C.) | | | | |
| Liquidus Temperature (° C.) - Internal | 1060 | 1080 | 1080 | 1070 |
| Liquidus - Primary Phase | Spodumene | Spodumene | Spodumene | Spodumene |
| Liquidus Viscosity (kP) - Internal | 411 | 349 | 314 | 367 |
| Measured Zircon Breakdown Temperature (° C.) | | | | |
| Stress Optical Coefficient (nm/mm/MPa) | 3.066 | 3.053 | 3.045 | 3.056 |
| Refractive Index | 1.5028 | 1.5039 | 1.5032 | 1.5023 |
| Poissons Ratio | 0.213 | 0.208 | 0.208 | 0.211 |
| E (Young's Modulus, GPa) | 75.7 | 76.3 | 75.7 | 75.4 |
| G (Shear Modulus, GPa) | 31.2 | 31.6 | 31.3 | 31.1 |
| *fibers cerammed | | | | |
| IOX | | | | |
| Max CT (Mpa) | 71.5 | 77.7 | 72.4 | 68.7 |
| K % for IOX | 80 | 80 | 80 | 80 |
| DOL (um) | 10.8 | 15.1 | 15.8 | 17.2 |
| CS (Mpa) | 631 | 634 | 625 | 610 |

| | Sample | | | |
|---|---|---|---|---|
| | 29 | 30 | 31 | 32 |
| $SiO_2$ | 65.67 | 65.72 | 61.76 | 61.88 |
| $Al_2O_3$ | 14.96 | 14.98 | 16.76 | 16.46 |
| $Li_2O$ | 8.44 | 8.09 | 7.20 | 6.67 |
| $Na_2O$ | 7.10 | 7.41 | 9.79 | 9.92 |
| $K_2O$ | | | | |
| MgO | | | 1.93 | 1.42 |
| ZnO | | | | |
| CaO | | | | |
| SrO | | | | |
| $B_2O_3$ | 1.22 | 1.20 | 0.50 | 3.54 |
| $P_2O_5$ | 2.47 | 2.47 | 1.94 | 0.00 |
| $SnO_2$ | 0.03 | 0.03 | 0.03 | 0.03 |
| Sum | 100 | 100 | 100 | 100 |
| $Al_2O_3$/(R₂O + RO) | 0.96 | 0.97 | 0.89 | 0.91 |
| $Al_2O_3$ + $Li_2O$ | 23.41 | 23.07 | 23.96 | 23.13 |
| $Na_2O$ + $Li_2O$ + $Al_2O_3$ + RO | 30.51 | 30.48 | 35.68 | 34.47 |
| $Al_2O_3$ + MgO + ZnO | 14.96 | 14.98 | 18.69 | 17.88 |
| $Al_2O_3$ + $B_2O_3$ | 16.18 | 16.18 | 17.26 | 20.00 |
| ($Al_2O_3$ + $B_2O_3$ + $P_2O_5$)/(R₂O + RO) | 1.20 | 1.20 | 1.01 | 1.11 |
| VFT Viscosity Coefficients | | | | |
| A | −3.11 | −3.62 | −3.44 | −3.83 |
| B | 8482.5 | 9733.5 | 8733.9 | 9765 |
| To | 93.8 | 10.5 | 78 | −29.5 |
| Temps at Fixed Viscosities (P) | | | | |
| 200 | 1661 | 1656 | 1600 | 1564 |
| 35000 | 1202 | 1203 | 1172 | 1137 |
| 200000 | 1102 | 1102 | 1078 | 1040 |
| $10^{11}$ Poise Temperature (° C.) | | | | |
| Density (g/cm³) | | | | |
| CTE (*$10^{-7}$ (1/° C.)) | | | | |
| Fiber Elongation Strain Point (° C.) | | | 586 | 541 |
| Fiber Elongation Annealing Point (° C.) | | | 636 | 590 |
| Fiber Elongation Softening Point (° C.) | | | 880.5 | 834.5 |
| Beam Bending Viscosity Strain Point (° C.) | | | | |
| Beam Bending Viscosity Annealing Point (° C.) | | | | |
| Beam Bending Viscosity Softening Point (° C.) | | | | |
| Liquidus Temperature (° C.) - Internal | 1120 | 1110 | 1050 | 1025 |
| Liquidus - Primary Phase | Spodumene | Spodumene | Spodumene | Spodumene |
| Liquidus Viscosity (kP) - Internal | 143 | 173 | 354 | 271 |
| Measured Zircon Breakdown Temperature (° C.) | | | | |
| Stress Optical Coefficient (nm/mm/MPa) | | | | |
| Refractive Index | | | | |
| Poissons Ratio | | | | |
| E (Young's Modulus, GPa) | | | | |
| G (Shear Modulus, GPa) | | | | |
| *fibers cerammed | | | | |
| IOX | | | | |

TABLE 1-continued

| | | | 85 | 80 |
|---|---|---|---|---|
| Max CT (Mpa) | | | 85 | 80 |
| K % for IOX | | | 80 | 80 |
| DOL (um) | | | 14.24 | 10.72 |
| CS (Mpa) | | | 680 | 720 |

| | Sample | | | |
|---|---|---|---|---|
| | 33 | 34 | 35 | 36 |
| $SiO_2$ | 67.79 | 66.81 | 66.25 | 65.77 |
| $Al_2O_3$ | 14.75 | 14.40 | 14.77 | 15.18 |
| $Li_2O$ | 6.25 | 7.79 | 7.83 | 7.82 |
| $Na_2O$ | 8.80 | 3.06 | 4.25 | 5.41 |
| $K_2O$ | | | | |
| MgO | 2.29 | | | |
| ZnO | | | | |
| CaO | | | | |
| SrO | | | | |
| $B_2O_3$ | 0.00 | 4.11 | 3.37 | 2.57 |
| $P_2O_5$ | 0.00 | 3.64 | 3.34 | 3.05 |
| $SnO_2$ | 0.03 | 0.05 | 0.04 | 0.04 |
| Sum | 100 | 100 | 100 | 100 |
| $Al_2O_3/(R_2O + RO)$ | 0.85 | 1.33 | 1.22 | 1.15 |
| $Al_2O_3 + Li_2O$ | 21.00 | 22.19 | 22.60 | 22.99 |
| $Na_2O + Li_2O + Al_2O_3 + RO$ | 32.09 | 25.25 | 26.85 | 28.41 |
| $Al_2O_3 + MgO + ZnO$ | 17.04 | 14.40 | 14.77 | 15.18 |
| $Al_2O_3 + B_2O_3$ | 14.75 | 18.51 | 18.14 | 17.75 |
| $(Al_2O_3 + B_2O_3 + P_2O_5)/(R_2O + RO)$ | 0.85 | 2.04 | 1.78 | 1.57 |
| VFT Viscosity Coefficients | | | | |
| A | −3.59 | −3.52 | −3.29 | −3.46 |
| B | 9618 | 9361.4 | 8722.1 | 9190.6 |
| To | 38.1 | 64.6 | 110.1 | 67.8 |
| Temps at Fixed Viscosities (P) | | | | |
| 200 | 1672 | 1673 | 1671 | 1662 |
| 35000 | 1221 | 1226 | 1224 | 1215 |
| 200000 | 1120 | 1126 | 1126 | 1116 |
| $10^{11}$ Poise Temperature (° C.) | | | | |
| Density (g/cm³) | | | | |
| CTE (*$10^{-7}$ (1/° C.)) | | | | |
| Fiber Elongation Strain Point (° C.) | 598 | | | |
| Fiber Elongation Annealing Point (° C.) | 650 | | | |
| Fiber Elongation Softening Point (° C.) | | | | |
| Beam Bending Viscosity Strain Point (° C.) | | | | |
| Beam Bending Viscosity Annealing Point (° C.) | | | | |
| Beam Bending Viscosity Softening Point (° C.) | | | | |
| Liquidus Temperature (° C.) - Internal | 1075 | 1135 | 1130 | 1125 |
| Liquidus - Primary Phase | Spodumene | Spodumene | Spodumene | Spodumene |
| Liquidus Viscosity (kP) - Internal | 489 | 169 | 184 | 170 |
| Measured Zircon Breakdown Temperature (° C.) | | | | |
| Stress Optical Coefficient (nm/mm/MPa) | | | | |
| Refractive Index | | | | |
| Poissons Ratio | | | | |
| E (Young's Modulus, GPa) | | | | |
| G (Shear Modulus, GPa) | | | | |
| *fibers cerammed | | | | |
| IOX | | | | |
| Max CT (Mpa) | 80 | | | |
| K % for IOX | 80 | | | |
| DOL (um) | 9.76 | | | |
| CS (Mpa) | 662 | | | |

| | Sample | | | |
|---|---|---|---|---|
| | 37 | 38 | 39 | 40 |
| $SiO_2$ | 65.27 | 64.62 | 64.28 | 62.46 |
| $Al_2O_3$ | 15.58 | 15.94 | 14.98 | 15.98 |
| $Li_2O$ | 7.85 | 7.85 | 7.86 | 7.85 |
| $Na_2O$ | 6.58 | 7.92 | 4.82 | 4.82 |
| $K_2O$ | | | | |
| MgO | | | | |
| ZnO | | | | |
| CaO | | | | |
| SrO | | | | |

TABLE 1-continued

|  |  |  |  |  |
|---|---|---|---|---|
| B$_2$O$_3$ | 1.77 | 0.99 | 4.90 | 4.78 |
| P$_2$O$_5$ | 2.75 | 2.47 | 2.96 | 3.93 |
| SnO$_2$ | 0.04 | 0.04 | 0.05 | 0.04 |
| Sum | 100 | 100 | 100 | 100 |
| Al$_2$O$_3$/(R$_2$O + RO) | 1.08 | 1.01 | 1.18 | 1.26 |
| Al$_2$O$_3$ + Li$_2$O | 23.43 | 23.79 | 22.84 | 23.82 |
| Na$_2$O + Li$_2$O + Al$_2$O$_3$ + RO | 30.01 | 31.71 | 27.66 | 28.64 |
| Al$_2$O$_3$ + MgO + ZnO | 15.58 | 15.94 | 14.98 | 15.98 |
| Al$_2$O$_3$ + B$_2$O$_3$ | 17.35 | 16.93 | 19.88 | 20.76 |
| (Al$_2$O$_3$ + B$_2$O$_3$ + P$_2$O$_5$)/(R$_2$O + RO) | 1.39 | 1.23 | 1.80 | 1.95 |
| VFT Viscosity Coefficients |  |  |  |  |
| A | −3.20 | −3.27 | −3.73 | −3.42 |
| B | 8563.4 | 8725.8 | 9716.3 | 8763.3 |
| To | 112.5 | 97 | 4.2 | 67.3 |
| Temps at Fixed Viscosities (P) |  |  |  |  |
| 200 | 1669 | 1664 | 1616 | 1600 |
| 35000 | 1218 | 1214 | 1179 | 1168 |
| 200000 | 1120 | 1115 | 1080 | 1073 |
| 10$^{11}$ Poise Temperature (° C.) |  |  |  |  |
| Density (g/cm$^3$) |  |  |  |  |
| CTE (*10$^{-7}$ (1/° C.)) |  |  |  |  |
| Fiber Elongation Strain Point (° C.) |  |  |  |  |
| Fiber Elongation Annealing Point (° C.) |  |  |  |  |
| Fiber Elongation Softening Point (° C.) |  |  |  |  |
| Beam Bending Viscosity Strain Point (° C.) |  |  |  |  |
| Beam Bending Viscosity Annealing Point (° C.) |  |  |  |  |
| Beam Bending Viscosity Softening Point (° C.) |  |  |  |  |
| Liquidus Temperature (° C.) - Internal | 1125 | 1105 | 1080 | 1110 |
| Liquidus - Primary Phase | Spodumene | Spodumene | Spodumene | Spodumene |
| Liquidus Viscosity (kP) - Internal | 181 | 245 | 202 | 98 |
| Measured Zircon Breakdown Temperature (° C.) |  |  |  |  |
| Stress Optical Coefficient (nm/mm/MPa) |  |  |  |  |
| Refractive Index |  |  |  |  |
| Poissons Ratio |  |  |  |  |
| E (Young's Modulus, GPa) |  |  |  |  |
| G (Shear Modulus, GPa) |  |  |  |  |
| *fibers cerammed |  |  |  |  |
| IOX |  |  |  |  |
| Max CT (Mpa) |  |  |  |  |
| K % for IOX |  |  |  |  |
| DOL (um) |  |  |  |  |
| CS (Mpa) |  |  |  |  |

|  | Sample | | | |
|---|---|---|---|---|
|  | 41 | 42 | 43 | 44 |
| SiO$_2$ | 60.47 | 63.41 | 64.52 | 63.18 |
| Al$_2$O$_3$ | 16.92 | 14.97 | 15.22 | 15.65 |
| Li$_2$O | 7.86 | 7.85 | 8.46 | 7.61 |
| Na$_2$O | 4.81 | 4.78 | 3.65 | 4.75 |
| K$_2$O |  |  |  |  |
| MgO |  |  |  |  |
| ZnO |  |  |  |  |
| CaO |  |  |  |  |
| SrO |  |  |  |  |
| B$_2$O$_3$ | 4.87 | 4.91 | 3.45 | 3.32 |
| P$_2$O$_5$ | 4.88 | 3.89 | 4.51 | 5.30 |
| SnO$_2$ | 0.04 | 0.04 | 0.04 | 0.04 |
| Sum | 100 | 100 | 100 | 100 |
| Al$_2$O$_3$/(R$_2$O + RO) | 1.34 | 1.19 | 1.26 | 1.27 |
| Al$_2$O$_3$ + Li$_2$O | 24.78 | 22.81 | 23.68 | 23.26 |
| Na$_2$O + Li$_2$O + Al$_2$O$_3$ + RO | 29.59 | 27.59 | 27.33 | 28.01 |
| Al$_2$O$_3$ + MgO + ZnO | 16.92 | 14.97 | 15.22 | 15.65 |
| Al$_2$O$_3$ + B$_2$O$_3$ | 21.79 | 19.88 | 18.67 | 18.96 |
| (Al$_2$O$_3$ + B$_2$O$_3$ + P$_2$O$_5$)/(R$_2$O + RO) | 2.11 | 1.88 | 1.91 | 1.96 |
| VFT Viscosity Coefficients |  |  |  |  |
| A | −3.20 | −3.68 | −3.29 | −3.31 |
| B | 8138.4 | 9752.6 | 8715.6 | 8803.5 |
| To | 112.6 | −5.6 | 93.8 | 83 |

TABLE 1-continued

| Temps at Fixed Viscosities (P) | | | | |
|---|---|---|---|---|
| 200 | 1591 | 1624 | 1652 | 1651 |
| 35000 | 1163 | 1180 | 1206 | 1203 |
| 200000 | 1070 | 1080 | 1108 | 1105 |
| $10^{11}$ Poise Temperature (° C.) | | | | |
| Density (g/cm$^3$) | | | | |
| CTE (*$10^{-7}$ (1/° C.)) | | | | |
| Fiber Elongation Strain Point (° C.) | | | | |
| Fiber Elongation Annealing Point (° C.) | | | | |
| Fiber Elongation Softening Point (° C.) | | | | |
| Beam Bending Viscosity Strain Point (° C.) | | | | |
| Beam Bending Viscosity Annealing Point (° C.) | | | | |
| Beam Bending Viscosity Softening Point (° C.) | | | | |
| Liquidus Temperature (° C.) - Internal | 1065 | 1065 | 1120 | 1070 |
| Liquidus - Primary Phase | Spodumene | Spodumene | Spodumene | Spodumene |
| Liquidus Viscosity (kP) - Internal | 220 | 266 | 159 | 404 |
| Measured Zircon Breakdown Temperature (° C.) | | | | |
| Stress Optical Coefficient (nm/mm/MPa) | | | | |
| Refractive Index | | | | |
| Poissons Ratio | | | | |
| E (Young's Modulus, GPa) | | | | |
| G (Shear Modulus, GPa) | | | | |
| *fibers cerammed | | | | |
| IOX | | | | |
| Max CT (Mpa) | | | | |
| K % for IOX | | | | |
| DOL (um) | | | | |
| CS (Mpa) | | | | |

| | Sample | | |
|---|---|---|---|
| | 45 | 46 | 47 |
| SiO$_2$ | 63.64 | 63.66 | 63.61 |
| Al$_2$O$_3$ | 15.39 | 16.19 | 16.22 |
| Li$_2$O | 8.10 | 8.07 | 7.99 |
| Na$_2$O | 7.30 | 8.11 | 8.20 |
| K$_2$O | | 0.52 | 0.52 |
| MgO | | 0.33 | 0.32 |
| ZnO | | | |
| CaO | | | |
| SrO | | | |
| B$_2$O$_3$ | 1.95 | 0.38 | 0.39 |
| P$_2$O$_5$ | 3.58 | 2.67 | 2.67 |
| SnO$_2$ | 0.05 | 0.05 | 0.05 |
| Sum | 100 | 100 | 100 |
| Al$_2$O$_3$/(R$_2$O + RO) | 1.00 | 0.95 | 0.95 |
| Al$_2$O$_3$ + Li$_2$O | 23.49 | 24.26 | 24.21 |
| Na$_2$O + Li$_2$O + Al$_2$O$_3$ + RO | 30.79 | 32.70 | 32.73 |
| Al$_2$O$_3$ + MgO + ZnO | 15.39 | 16.53 | 16.55 |
| Al$_2$O$_3$ + B$_2$O$_3$ | 17.34 | 16.58 | 16.62 |
| (Al$_2$O$_3$ + B$_2$O$_3$ + P$_2$O$_5$)/(R$_2$O + RO) | 1.36 | 1.13 | 1.13 |
| VFT Viscosity Coefficients | | | |
| A | −3.74 | −2.91 | −3.53 |
| B | 10098.8 | 7803.3 | 9361 |
| To | −29.6 | 146.2 | 28.1 |
| Temps at Fixed Viscosities (P) | | | |
| 200 | 1642.37 | 1643.95 | 1634.58 |
| 35000 | 1189.61 | 1193.19 | 1188.07 |
| 200000 | 1087.52 | 1096.66 | 1088.59 |
| $10^{11}$ Poise Temperature (° C.) | | | |
| Density (g/cm$^3$) | 2.370 | | |
| CTE (*$10^{-7}$ (1/° C.)) | 70.7 | | |
| Fiber Elongation Strain Point (° C.) | 543 | | |
| Fiber Elongation Annealing Point (° C.) | 597 | | |
| Fiber Elongation Softening Point (° C.) | 867.9 | | |
| Beam Bending Viscosity Strain Point (° C.) | | | |
| Beam Bending Viscosity Annealing Point (° C.) | | | |
| Beam Bending Viscosity Softening Point (° C.) | | | |
| Liquidus Temperature (° C.) - Internal | 1070 | 1100 | 1115 |
| Liquidus - Primary Phase | | | |

TABLE 1-continued

| | | | |
|---|---|---|---|
| Liquidus Viscosity (kP) - Internal | 279 | 187 | 122 |
| Measured Zircon Breakdown Temperature (° C.) | | | |
| Stress Optical Coefficient (nm/mm/MPa) | | | |
| Refractive Index | | | |
| Poissons Ratio | | | |
| E (Young's Modulus, GPa) | | | |
| G (Shear Modulus, GPa) | | | |
| *fibers cerammed | | | |
| IOX | | | |
| Max CT (Mpa) | | | 72 |
| K % for IOX | | | 70 |
| DOL (um) | | | 10 |
| CS (Mpa) | | | 570 |

All compositional components, relationships, and ratios described in this specification are provided in mol % unless otherwise stated. All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

As used herein, a trailing 0 in a number is intended to represent a significant digit for that number. For example, the number "1.0" includes two significant digits, and the number "1.00" includes three significant digits.

What is claimed is:

1. A glass composition comprising:
   from greater than or equal to 55.0 mol % to less than or equal to 70.0 mol % $SiO_2$;
   from greater than or equal to 12.0 mol % to less than or equal to 20.0 mol % $Al_2O_3$;
   from greater than 0 mol % to less than or equal to 7.5 mol % $B_2O_3$;
   from greater than or equal to 5.0 mol % to less than or equal to 15.0 mol % $Li_2O$; and
   from greater than or equal to 4.0 mol % to less than or equal to 9.5 mol % $Na_2O$, wherein:
   $-8.00$ mol %$\leq R_2O+RO-Al_2O_3-B_2O_3-P_2O_5 \leq -1.75$ mol %,
   $9.10 \leq (SiO_2+Al_2O_3+Li_2O)/Na_2O$,
   $1.80 \leq (Li_2O+Al_2O_3+P_2O_5)/(Na_2O+B_2O_3) \leq 3.50$,
   $Al_2O_3+Li_2O$ is greater than 21.4 mol %, and
   RO is a sum of divalent cation oxides selected from the group consisting of MgO, CaO, SrO, BaO, FeO, and ZnO, and $R_2O$ is a sum of alkali metal oxides selected from the group consisting of $Li_2O$, $Na_2O$, $K_2O$, $Rb_2O$, $Cs_2O$, and $Fr_2O$.

2. The glass composition of claim 1, wherein $-7.50$ mol %$\leq R_2O+RO-Al_2O_3-B_2O_3-P_2O_5 \leq -2.50$ mol %.

3. The glass composition of claim 1, wherein $9.10 \leq (SiO_2+Al_2O_3+Li_2O)/Na_2O \leq 16.00$.

4. The glass composition of claim 1, wherein $9.20 \leq (SiO_2+Al_2O_3+Li_2O)/Na_2O \leq 15.50$.

5. The glass composition of claim 1, wherein $1.80 \leq (Li_2O+Al_2O_3+P_2O_5)/(Na_2O+B_2O_3) \leq 3.35$.

6. The glass composition of claim 1, wherein $B_2O_3+P_2O_5$ is greater than 0.0 mol %.

7. The glass composition of claim 1, wherein $1.00 \leq (Li_2O+Al_2O_3)/(Na_2O+B_2O_3+P_2O_5) \leq 2.75$.

8. The glass composition of claim 1, wherein $Al_2O_3+Li_2O+Na_2O$ is greater than 25.0 mol %.

9. The glass composition of claim 1, wherein $0.90 < Al_2O_3/(R_2O+RO) < 1.20$.

10. The glass composition of claim 1, wherein $1.0 < (Al_2O_3+B_2O_3+P_2O_5)/(R_2O+RO)$.

11. The glass composition of claim 1, wherein $6.96Al_2O_3-1.90B_2O_3+2.16CaO+3.30MgO-1.50Na_2O+12.74Li_2O-1.10SrO-14.50K_2O-1.87La_2O_3+6.13ZrO_2-76.40$ mol %$>50.00$ mol %.

12. A glass composition comprising:
   from greater than or equal to 60.0 mol % to less than or equal to 70.0 mol % $SiO_2$;
   from greater than or equal to 12.0 mol % to less than or equal to 18.0 mol % $Al_2O_3$;
   from greater than 0 mol % to less than or equal to 7.5 mol % $B_2O_3$;
   from greater than or equal to 5.0 mol % to less than or equal to 10.0 mol % $Li_2O$;
   from greater than or equal to 4.0 mol % to less than or equal to 9.5 mol % $Na_2O$; and
   greater than or equal to 0.75 mol % $P_2O_5$, wherein:
   $Li_2O/Na_2O$ greater than or equal to 1.00, and
   $Al_2O_3+Li_2O$ less than or equal to 25.25 mol % and greater than 21.4 mol %.

* * * * *